US010928917B2

United States Patent
Jain et al.

(10) Patent No.: US 10,928,917 B2
(45) Date of Patent: Feb. 23, 2021

(54) MULTIPLE USER INTERACTION WITH AUDIO DEVICES USING SPEECH AND GESTURES

(71) Applicant: International Business Machines Corporation, Armonk, NY (US)

(72) Inventors: Mohit Jain, Bengaluru (IN); Pratyush Kumar, Chennai (IN); Anup Agarwal, Assam (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/951,573

(22) Filed: Apr. 12, 2018

(65) Prior Publication Data

US 2019/0317606 A1    Oct. 17, 2019

(51) Int. Cl.
| | | |
|---|---|---|
| G06F 3/01 | (2006.01) | |
| G06F 3/16 | (2006.01) | |
| G06F 3/043 | (2006.01) | |
| G06T 7/262 | (2017.01) | |
| H03D 1/00 | (2006.01) | |

(52) U.S. Cl.
CPC .............. G06F 3/017 (2013.01); G06F 3/043 (2013.01); G06F 3/167 (2013.01); G06T 7/262 (2017.01); H03D 1/00 (2013.01)

(58) Field of Classification Search
CPC ........... G06F 3/017; G06F 3/043; G06F 3/167
See application file for complete search history.

(56) References Cited

U.S. PATENT DOCUMENTS

| | | | |
|---|---|---|---|
| 6,243,471 B1 | 6/2001 | Brandstein et al. | |
| 9,264,151 B1 * | 2/2016 | Emigh | G06Q 30/0211 |
| 9,363,598 B1 | 6/2016 | Yang | |
| 9,432,768 B1 | 8/2016 | O'Neill et al. | |
| 9,595,997 B1 | 3/2017 | Yang | |
| 9,621,984 B1 | 4/2017 | Chu | |
| 9,761,011 B2 | 9/2017 | Utsunomiya et al. | |
| 9,811,311 B2 * | 11/2017 | Smus | G01S 11/14 |

(Continued)

OTHER PUBLICATIONS

Lyons, Rick, A Quadratic Signals Tutorial: Complex but not Complicated, Apr. 13, 2013, DSPRelated, pp. 1-46 (Year: 2013).*

(Continued)

*Primary Examiner* — Amr A Awad
*Assistant Examiner* — Maheen I Javed
(74) *Attorney, Agent, or Firm* — Ryan, Mason & Lewis, LLP

(57) ABSTRACT

Methods, systems and computer program products for speech and gesture interaction of multiple users with devices using voice activated interfaces are provided herein. A computer-implemented method includes transmitting a pilot signal from a device comprising a voice activated interface, the pilot signal having a frequency, detecting motion of at least one user around the device, associating the detected motion with a gesture, and performing a function in response to the gesture. Detecting the motion includes receiving a reflected signal of the pilot signal caused by the motion of the at least one user, and detecting a shift in the reflected signal from the pilot signal, wherein detecting the shift comprises determining one or more differences between a waveform corresponding to the pilot signal and a waveform corresponding to the reflected signal.

17 Claims, 19 Drawing Sheets

(56) References Cited

U.S. PATENT DOCUMENTS

| | | | | |
|---|---|---|---|---|
| 9,955,281 | B1* | 4/2018 | Lyren | H04S 7/304 |
| 2012/0313900 | A1* | 12/2012 | Dahl | G06F 3/043 |
| | | | | 345/177 |
| 2013/0044073 | A1* | 2/2013 | Christiansson | G06F 3/0421 |
| | | | | 345/173 |
| 2013/0245486 | A1* | 9/2013 | Simon | A61B 5/4035 |
| | | | | 600/546 |
| 2015/0309639 | A1* | 10/2015 | Amarilio | G06F 3/045 |
| | | | | 345/174 |
| 2017/0300186 | A1 | 10/2017 | Kuhar et al. | |
| 2018/0364813 | A1* | 12/2018 | Sayah | H04L 63/083 |

OTHER PUBLICATIONS

Lyons, Rick, "A Quadratic Signals Tutorial: Complex but not Complicated," Apr. 13, 2013, DSPRelated, pp. 1-14 (Year: 2013).*
Feng Su, "Acoustic Imaging Using a 64-Node Microphone Array and Beamformer System," IEEE International Symposium on Signal Processing and Information Technology (ISSPIT), Dec. 7, 2015 to Dec. 10, 2015, pp. 168-173.
K. Kalgaonkar et al., "One-Handed Gesture Recognition Using Ultrasonic Doppler Sonar," IEEE International Conference on Acoustics, Speech and Signal Processing (ICASSP), Apr. 19-.
Y.-T. Liu et al., "SoundSense: 3D Gesture Sensing Using Ultrasound on Mobile Devices," Research Project, May 2012, 7 pages.
S.J. Lee et al., "Finger Gesture Recognition Using Microphone Arrays," 2014, 5 pages.
R. Nandakumar et al., "FingerIO: Using Active Sonar for Fine-Grained Finger Tracking," ACM Conference on Human Factors in Computing Systems (CHI), May 7-12, 2016, 11 pages.
W. Wang et al., "Device-Free Gesture Tracking Using Acoustic Signals," 22nd Annual International Conference on Mobile Computing and Networking (MobiCom), Oct. 3-7, 2016, pp. 82-94.
S. Yun et al., "Strata: Fine-Grained Acoustic-Based Device-Free Tracking," 15th Annual International Conference on Mobile Systems, Applications, and Services (MobiSys), Jun. 19-23, 2017, pp. 15-28.
S.P. Tarzia et al., "Sonar-Based Measurement of User Presence and Attention," 11th International Conference on Ubiquitous Computing (UbiComp), Sep. 30-Oct. 3, 2009, pp. 89-92.
S. Gupta et al, "SoundWave: Using the Doppler Effect to Sense Gestures," ACM Conference on Human Factors in Computing Systems (CHI), May 5-10, 2012, pp. 1911-1914.
F. Adib et al., "Capturing the Human Figure Through a Wall," ACM Transactions on Graphics (TOG)—Proceedings of ACM SIG-GRAPH Asia, Nov. 2015, 13 pages, vol. 34, No. 6.
Werner De Bruijn, "Making All the Right Noises: Shaping Sound with Audio Beamforming," MathWorks Technical Articles and Newsletters, 2013, 6 pages.
google.com, "Your Hands are the Only Interface You'll Need," https://atap.google.com/soli/, Apr. 10, 2018, 8 pages.
D.M. Van Willigen et al., "In-Air Ultrasonic Gesture Sensing with MEMS Microphones," IEEE Sensors, Nov. 2-5, 2014, 4 pages.
Wikipedia, Microsoft Kinect, Sep. 18, 2018.
Morris et al., RecoFit: Using a Wearable Sensor to Find, Recognize, and Count Repetitive Exercises. CHI 2014.
Gupta et al., SoundWave: Using the Doppler Effect to Sense Gestures. CHI 2012.
Adib et al., Capturing the Human Figure Through a Wall. SIG-GRAPH 2015.
Wang et al., Device-Free Gesture Tracking Using Acoustic Signals. MobiCom 2016.
Yun et al., Strata: Fine-Grained Acoustic-based Device-Free Tracking. MobiSys 2017.
Kalgaonkar et al., One handed gesture recognition using ultrasonic Doppler sonar. ICASSP 2009.
Tarzia et al., Sonar-based Measurement of User Presence and Attention. Ubicomp 2009.
Nandakumar et al., FingerIO: Using Active Sonar for Fine-Grained Finger Tracking, CHI 2015.
Wikipedia, Google ATAP, https://en.wikipedia.org/w/index.php?title=Google_ATAP&oldid=829859615, Mar. 11, 2018.

* cited by examiner

MULTIPLE USER INTERACTION WITH AUDIO DEVICES USING SPEECH AND GESTURES

FIELD

The present invention relates to user interaction with voice activated audio devices, and more specifically, to interaction of multiple users with voice activated audio devices from a distance using speech and gestures.

BACKGROUND

A new class of voice activated audio devices (e.g., Amazon Echo®, Google Home™, Apple HomePod™) has emerged. In general, the voice activated audio devices include a voice-controlled hands-free speaker as an audio output system, which is capable of connecting to the Internet and web-based services to, for example, play music, and provide responses to requests for information, including, but not necessarily limited to, news, weather, sporting event results, and posed questions. Such devices enjoy significant consumer interest. For example, 5 million Echo® devices were sold in the United States in the fourth quarter (Q4) of 2016, and CNBC has opined that the Amazon Alexa® information service, which is used by Amazon Echo® to provide entertainment and information to requesting users, could be a $10 billion "mega-hit" by 2020.

However, for certain scenarios, voice interaction alone may not be sufficient. For example, when a user is on a phone call, in order not to interrupt the call, the user may want to silence the voice activated audio devices without using a voice command. In another example, the voice activated audio devices can be vulnerable to security attacks by, for example, recorded sounds which can be played to fool the device that an authorized user is actually requesting information or authorizing a transaction. Additionally, the voice activated audio devices generally do not provide notifications (e.g., news updates) unless explicitly requested to do so. Conventional voice activated audio devices are also limited to interaction with one user at a time, and are not configured for simultaneous interaction with multiple users.

SUMMARY

Embodiments of the invention provide techniques for interaction with devices utilizing voice activated interfaces, and more particularly, to enabling multiple users to use speech and gestures to interact from a distance with devices utilizing voice activated interfaces.

According to an exemplary embodiment of the present invention, a computer-implemented method comprises transmitting a pilot signal from a device comprising a voice activated interface, the pilot signal having a frequency, detecting motion of at least one user around the device, associating the detected motion with a gesture, and performing a function in response to the gesture. Detecting the motion includes receiving a reflected signal of the pilot signal caused by the motion of the at least one user, and detecting a shift in the reflected signal from the pilot signal, wherein detecting the shift comprises determining one or more differences between a waveform corresponding to the pilot signal and a waveform corresponding to the reflected signal.

Another embodiment of the invention or elements thereof can be implemented in the form of an article of manufacture tangibly embodying computer readable instructions which, when implemented, cause a computer to carry out a plurality of method steps, as described herein. Furthermore, another embodiment of the invention or elements thereof can be implemented in the form of an apparatus including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

DETAILED DESCRIPTION

Figure 1:
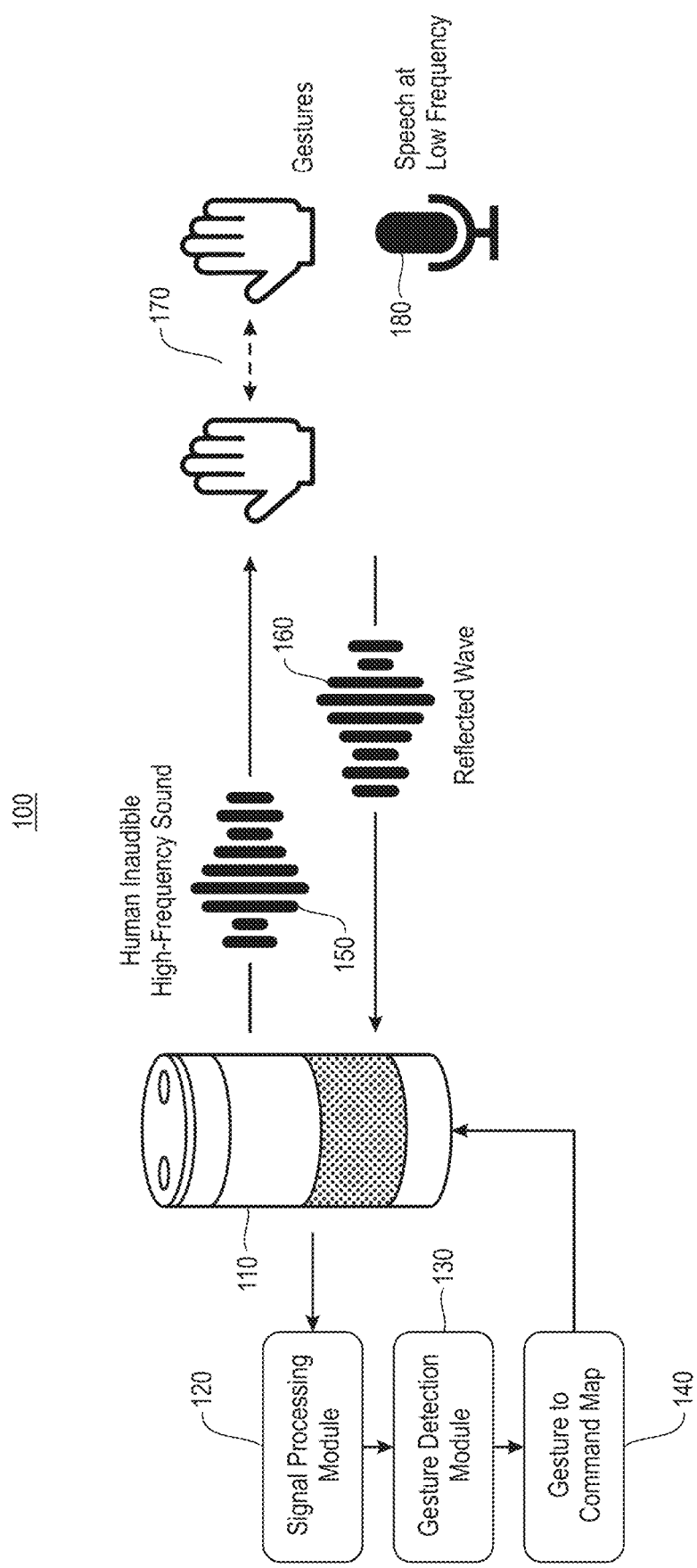
FIG. 1 depicts a system for gesture detection, according to an exemplary embodiment of the present invention.

Illustrative embodiments of the invention may be described herein in the context of illustrative methods, systems and devices for multiple user interaction with devices utilizing voice activated interfaces. However, it is to be understood that embodiments of the invention are not limited to the illustrative methods, systems and devices but instead are more broadly applicable to other suitable methods, systems and devices.

In accordance with an embodiment of the present invention, a device configured for voice interaction is also configured to detect and respond to user gestures. For example, a user can silence the device without using a voice command by using a simple hand gesture (e.g., a stop hand gesture). In another example, users can confirm their physical presence near a device configured for voice interaction and gesture detection by performing a gesture (e.g., hand wave) a predetermined number of times, which can be detected by the device. As a result, security attacks in the absence of a user, which are based on recorded voices, can be prevented. In a further example, a device configured for voice interaction and gesture detection can detect movement of a person in a room and begin proactive notifications in response to the person's presence.

Embodiments of the present invention provide a voice-activated audio device which is not limited to voice interaction and supports multimodal interaction, combining, for example, gestures with speech. In accordance with an embodiment, users can verbally request that the volume of a device be increased, while also moving their hand to fine tune the volume level. For example, in addition to verbally requesting a volume change, users can move their hands upward or downward, which can be detected by the device as instructions to respectively increase or decrease the volume. The speed and/or distance (e.g., height) at which the users move their hands up or down can also be detected to conclude a small incremental volume change (e.g., relatively slow speed and/or small distance) or a larger volume change (e.g., relatively fast speed and/or large distance). In contrast, fine-tuning the volume by using only speech can be cumbersome.

In accordance with embodiments of the present invention, devices equipped with a microphone array to detect voice commands from a distance (e.g., between about 0 and about 5 meters) and respond back to a user with audio signals (e.g., Google Home™, Amazon Echo®, and Apple HomePod™ devices) are further configured to detect far-field human motion gestures by analyzing beam-formed signals of reflected ultrasound pilot tones to detect frequency (e.g., Doppler) shifts, phase shifts or both frequency and phase shifts. Like the voice commands, gestures are also detectable up to about 5 meters from the device, but the embodiments of the present invention are not necessarily limited thereto, and may be configured to detect gestures at greater distances. The microphone array as described further herein, can comprise, but is not necessarily limited to, 2 to 8 microphones arranged in close proximity to each other at predetermined points. An increased number of microphones positioned at closer distances from each other than a smaller number of microphones positioned at larger distances from each other can increase a range of the device, for example, beyond 5 meters. In general, embodiments of the present invention can detect gestures a distances greater than 0 meters to approximately 5 meters from the device. According to an embodiment of the present invention, other than an ability to respond to and detect voice and gestures, the devices do not include an additional user interface.

Embodiments of the present invention comprise beam-forming a microphone array of a device configured for voice interaction to receive a reflected pilot tone in such a way to increase the range of detection of any audio features, including Doppler shift, phase shift or both Doppler and phase shift. Doppler shift of the reflected waveform is the shift in the frequency of a signal due to motion of the reflecting surface. The frequency increases if the surface moves closer towards the microphone, and vice versa. Beam-forming refers to a signal processing technique used in a transmission/receiver array for directional signal reception. The elements in the microphone array can be combined so that signals at particular angles experience constructive interference while others experience destructive interference. Beam-forming can be used in transmission and receipt of signals to achieve spatial selectivity.

Embodiments of the present invention can support a host of valuable applications on voice interaction devices, such as, but not necessarily limited to, (i) a security mechanism for voice interaction devices with a motion captcha to distinguish human from machine input (e.g., the motion captcha may require a user to perform a gesture to confirm a payment or another transaction); (ii) providing proactive notifications upon the detection of certain gestures (e.g., reading voicemail upon detecting entry of a human into an area of the voice-activated audio devices); (iii) combining multiple modalities of input, such as, voice and gesture, (e.g., volume control as described herein and/or speed-modulated navigation (e.g., scrubbing) through an audio clip); and (iv) providing accessibility features to, for example, users with limited speech capabilities.

In accordance with an embodiment of the present invention, spatial filtering (e.g., beam-forming) capabilities on a microphone array are utilized to identify multiple users, map the location of each user, detect audio and gesture input from multiple users, and respond accordingly. A system and associated methods enable voice interaction devices to engage with multiple users simultaneously with voice and gesture-based modalities by identifying and authenticating individual users based on their voice sample from a wake-up word or introduction phrase, and simultaneously mapping all users to specific locations based on a combination of beam-forming methods. A wake-up word or introduction phrase is a word or phrase that the system recognizes in order to commence a dialogue with a user. Examples of a wake-up word or introduction phrase include, but are not limited to, "Alexa" and "Ok Google." According to an embodiment of the present invention, the beam-forming methods use voice samples from wake-up words or introduction phrases to determine audio cues for users to change their position and/or to determine modifications to pilot tonal frequency in case the users' locations are too close to each other for accurately discriminating their gestures. Gestures of multiple users can be simultaneously detected by using a combination of beam-forming methods (e.g., time-delay, Frost, active) along with gesture detection methods (e.g., Doppler, phase shift) in connection with inaudible acoustic waveforms. Embodiments of the present invention further provide platform features to allow developers to write multi-modal and multi-user chatbots that can take as input inferred utterances and gestures of multiple people, and engage with the multiple people through the audio-output of the device. A chatbot refers to a computer program which is configured to conduct a conversation with a human user via auditory methods.

FIG. 1 is a block diagram of a system for gesture detection, according to an exemplary embodiment of the present invention. As shown in FIG. 1 by lines and/or arrows, the components of the system 100 are operatively coupled to each other via, for example, physical connections, such as wired and/or direct electrical contact connections, and/or wireless connections, such as, for example, Wi-Fi™, BLUETOOTH®, IEEE 802.11, and/or networks, including but not limited to, a local area network (LAN), wide area network (WAN), cellular network, ad hoc networks, WANET, satellite network or the Internet.

Figure 4B:
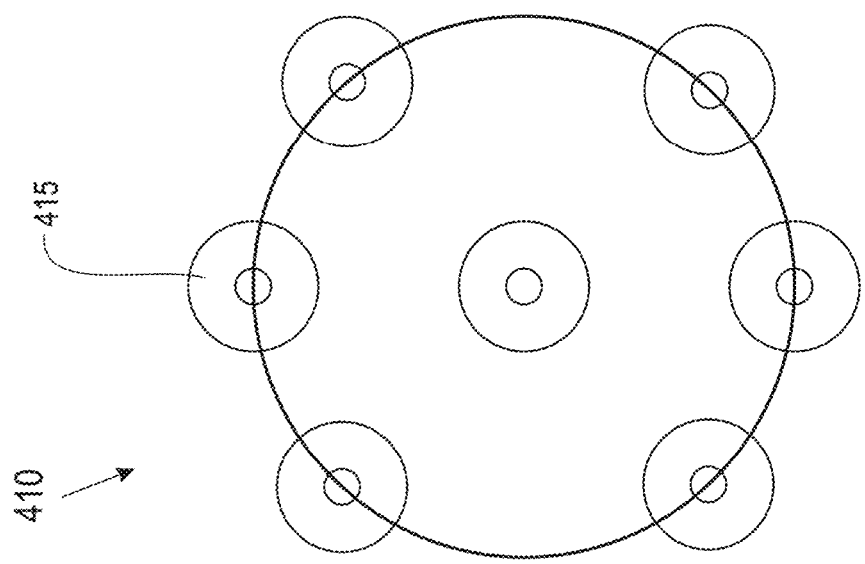
FIG. 4B depicts a far-field array of microphones, according to an exemplary embodiment of the present invention.

By way of non-limiting example, in accordance with an embodiment of the present invention, referring to FIG. 1, the system 100 includes a device 110, such as, for example, a voice interactive device (e.g., Amazon Echo®, Google Home™, Apple HomePod™), which includes a voice activated interface for interfacing with a human user, and outputs audio responses in response to user inquiries and/or prompts. The system 100 further includes, and the device 110 is operatively coupled to, a signal processing module 120, a gesture detection module 130 and a gesture to command map module 140. In accordance with an embodiment of the present invention, the device 110 includes a speaker which outputs a high frequency pilot signal 150 which produces a sound that is not audible to humans. The pilot signal 150 is continuously emitted from the device 110 and has a frequency of, for example, greater than 20 kHz, which is outside the audible spectrum for human ears. The device 110 further includes a plurality of microphones, which can be arranged as an array, in for example, a circular or other-shaped configuration. For example, FIG. 4B shows an array of 6 microphones 415 arranged around a circumference and a microphone 415 in a center of the 6 microphones. The plurality of microphones receive, for example, user voice signals, and reflected pilot signals 160.

According to an embodiment of the present invention, a user performs a gesture 170, including, but not necessarily limited to, a hand gesture, such as a wave, stop motion, raise up/bring down motion, etc. When a gesture 170, such as, for example, a hand movement, is made, the gesture 170 acts as a reflector so that the frequency and/or phase of the reflected pilot signal 160 perceived by a microphone of the device changes. This change in frequency is directly related to the speed of the gesture and the frequency of the pilot signal 150 emitted by the speaker. When there is no moving user in the surrounding environment, there is no detected frequency or phase shift.

Figure 3:
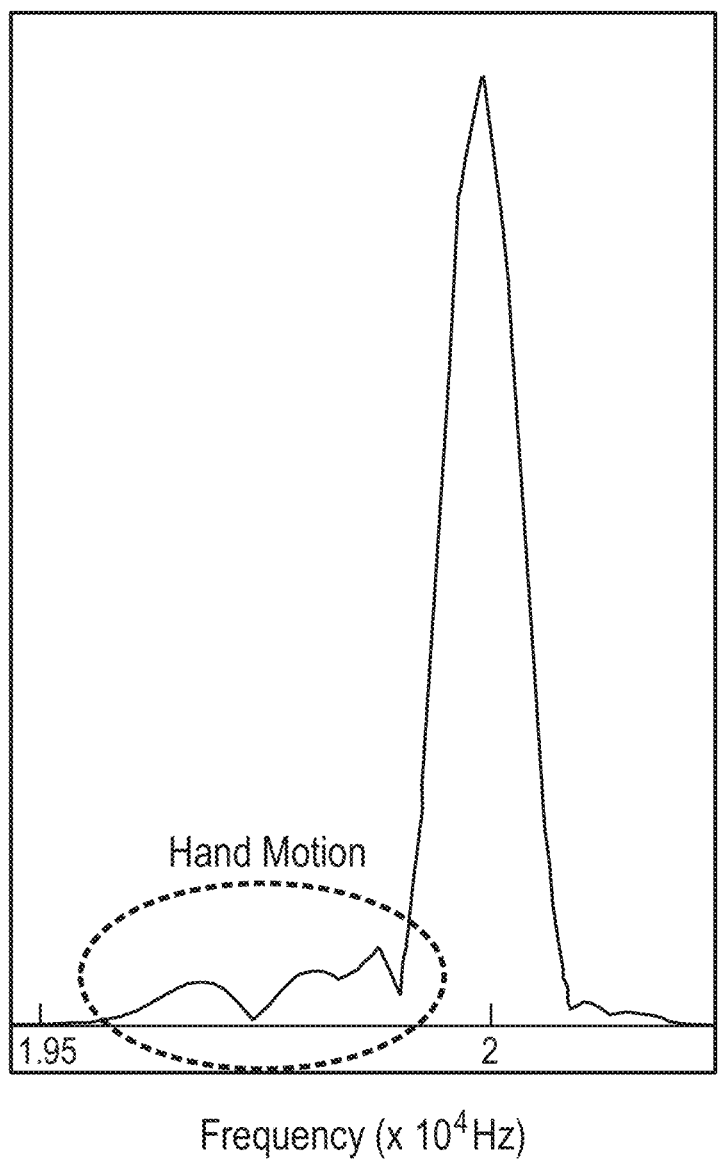
FIG. 3 is a graph illustrating a frequency shift caused by a moving object, according to an exemplary embodiment of the present invention.

Referring to the graph 300 in FIG. 3, the Doppler shift is the apparent shift in frequency of a waveform in response to a moving object. This shift is described by the equation (1):

$$F_{shift} = F_p * \left(\frac{c+v}{c-v}\right) \quad (1)$$

where $F_{shift}$: perceived frequency (e.g., changed frequency), $F_p$: Frequency emitted by the speaker (e.g., pilot frequency), c: speed of sound in the medium, and v: component of velocity toward the microphone (e.g., velocity of the gesture).

As can be seen in FIG. 3, a hand motion causes a frequency shift from the approximately 20 KHz pilot signal to about 19.5 KHz. A higher velocity gesture causes a greater frequency shift. Referring back to FIG. 1, the signal processing module 120 processes a signal received from the device 110 regarding the frequency shift for analysis by the gesture detection module 130, and sends the processed signal to the gesture detection module 130. The gesture detection module 130 calculates the frequency shift using, for example, equation (1) above and/or determines the phase shift of the reflected signal using phase shift techniques discussed further herein. Based on the determined frequency and/or phase shift, the gesture detection module 130 determines which gesture was made. The gesture detection module 130 may utilize a database (not shown) of predefined gestures and corresponding frequency and/or phase shifts, which can be populated by programming and/or through artificial intelligence (AI) methods, such as machine learning techniques, where the system learns frequency and/or phase shifts and their corresponding gestures through training data sets. In accordance with an embodiment of the present invention, each gesture 170 results in a unique deviation (with respect to frequency and/or phase shift) to the pilot signal, which is present in the reflected signal. A machine learning classification method can be used to identify the unique signature caused by a particular gesture. Machine learning techniques may include, but are not necessarily limited to, a Support Vector Machine (SVM), a Multilayer Perceptron (MLP), a deep learning model, clustering and a neural network.

The gesture to command map module 140 maps determined gestures to their corresponding functions. For example, if it is determined based on a frequency and/or phase shift that a gesture is an up/down motion, the system may conclude that the gesture 170 represents a request to change the volume of the device 110. The gesture may also be accompanied by a verbal request 180 to change the volume, which the system 100 can use as data when determining the type of gesture being made. As noted above, a slower speed and/or smaller distance at which the users move their hands up or down can also be detected to conclude a smaller incremental volume change, while a faster speed and/or larger distance at which the users move their hands up or down can also be detected to conclude a larger incremental volume change.

Other gestures 170 which may be detected include, but are not necessarily limited to, a stop hand gesture indicating a request to silence the device 110, hand waves to confirm users' physical presence near a device, and/or lateral hand movement (left to right or vice versa) to perform speed-modulated navigation (e.g., scrubbing) through an audio clip.

Figure 2:
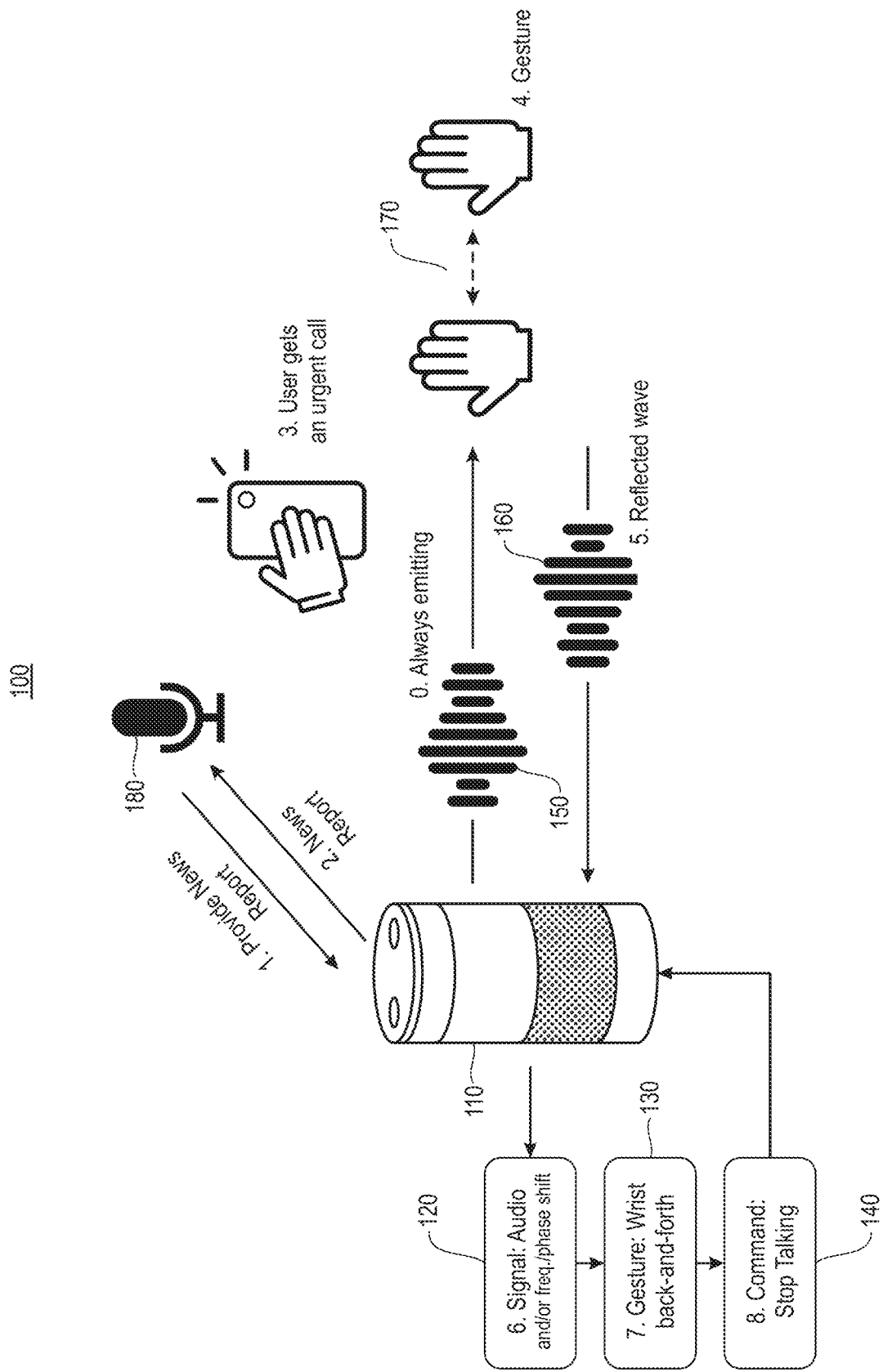
FIG. 2 illustrates a system representation of a process for gesture detection, according to an exemplary embodiment of the present invention.

FIG. 2 illustrates a system representation of a process for gesture detection, according to an exemplary embodiment of the present invention. Referring to FIG. 2, as noted in connection with FIG. 1, the device 110 continuously emits high frequency pilot signal 150 (element 0). In an operational example, a user may verbally request that the device 110 provide a news report (element 1), and the device 110 provides audio of a news report (element 2). Then, at element 3, a user may receive an urgent call where the user will want to the device 110 to cease providing the news report, but does not want to verbalize the request. In this case, at element 4, the user makes a gesture 170 (e.g., back-and-forth hand motion) to tell the device 110 to stop playing the news audio clip. As noted above, referring to element 5, the gesture 170 results in a reflected signal 160 with a shifted frequency or phase from the pilot signal 150. Referring to elements 6-8, the signal processing module 120 processes a signal received from the device 110 regarding the frequency and/or phase shift and/or accompanying audio for analysis by the gesture detection module 130. The gesture detection module 130 calculates the frequency shift using, for example, equation (1) above and/or a phase shift using phase shift techniques, and based on the determined frequency and/or phase shift, the gesture detection module 130 determines which gesture was made (in this case, a back-and-forth hand/wrist motion). The gesture to command map module 140 maps determined gesture to its corresponding function, and, in this example, generates a command to the device to stop the news report so that the user can continue the call with the device 110 being silenced.

Figure 4A:
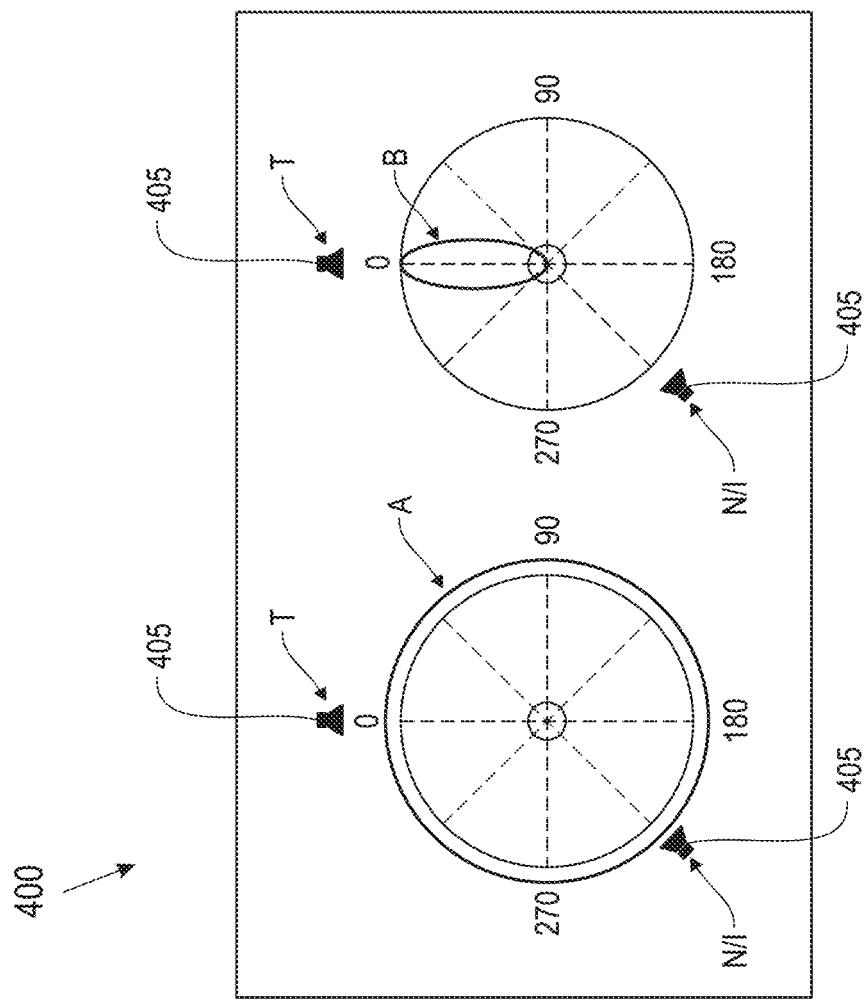
FIG. 4A is a diagram illustrating beam-forming, according to an exemplary embodiment of the present invention.

FIG. 4A is a diagram illustrating beam-forming, according to an exemplary embodiment of the present invention. Beam-forming or spatial filtering is a signal processing technique that helps achieve directional transmission and/or reception. This is done by leveraging a transmitter/receiver array. Referring to FIG. 4A, the signals received by the elements of the array (e.g., signals 405 generated by one or more speakers and received by microphones) are combined in a way that signals coming from a certain direction in space interfere constructively while others interfere destructively. Beam-forming can increase signal to noise ratio, which can increase a range of the device 110 to detect gestures from greater distances with respect to the device. FIG. 4A illustrates a focused beam (beam-formed) pattern for a user at 0° (element B), as opposed to an omnidirectional beam pattern (element A). Signals 405 marked T represent "targets" corresponding to a user location (e.g., 0°), and signals 405 marked N/I correspond to signals causing noise/interference.

In accordance with an embodiment of the present invention, the signals 405 are generated by a speaker in the device (e.g., device 110) and received by microphones (e.g., microphones 415) in a microphone array of the device.

The generated signals are of high frequency (e.g., above 18-20 kHz) and may be the pilot signal 150 (or 850_1-850_3) as described herein. The generated signal either reaches the microphones directly, or gets reflected by, for example, a user, and then reaches the microphones. In the case of being reflected by a user, the signal received by the microphone is the reflected signal 160 (or 860_1-860_3) as described herein In a microphone array including a plurality of microphones (e.g., 6+ microphones 415), each of the microphones receives the same generated or reflected signal, but with some time-delay (as the position of each of the microphones in the microphone array is different). A beam-forming algorithm is applied to combine all the received generated or reflected signals to increase the signal-to-noise ratio (SNR).

FIG. 4B depicts a far-field array of microphones, according to an exemplary embodiment of the present invention. As noted above, in connection with an embodiment of a device 110, FIG. 4B shows an array of 6 microphones 415 arranged around a circumference and a microphone 415 in a center of the 6 microphones. The microphones 415 are simultaneously operated to detect and receive user voice signals and reflected pilot signals 160 (or 860_1-860_3).

Figure 5:
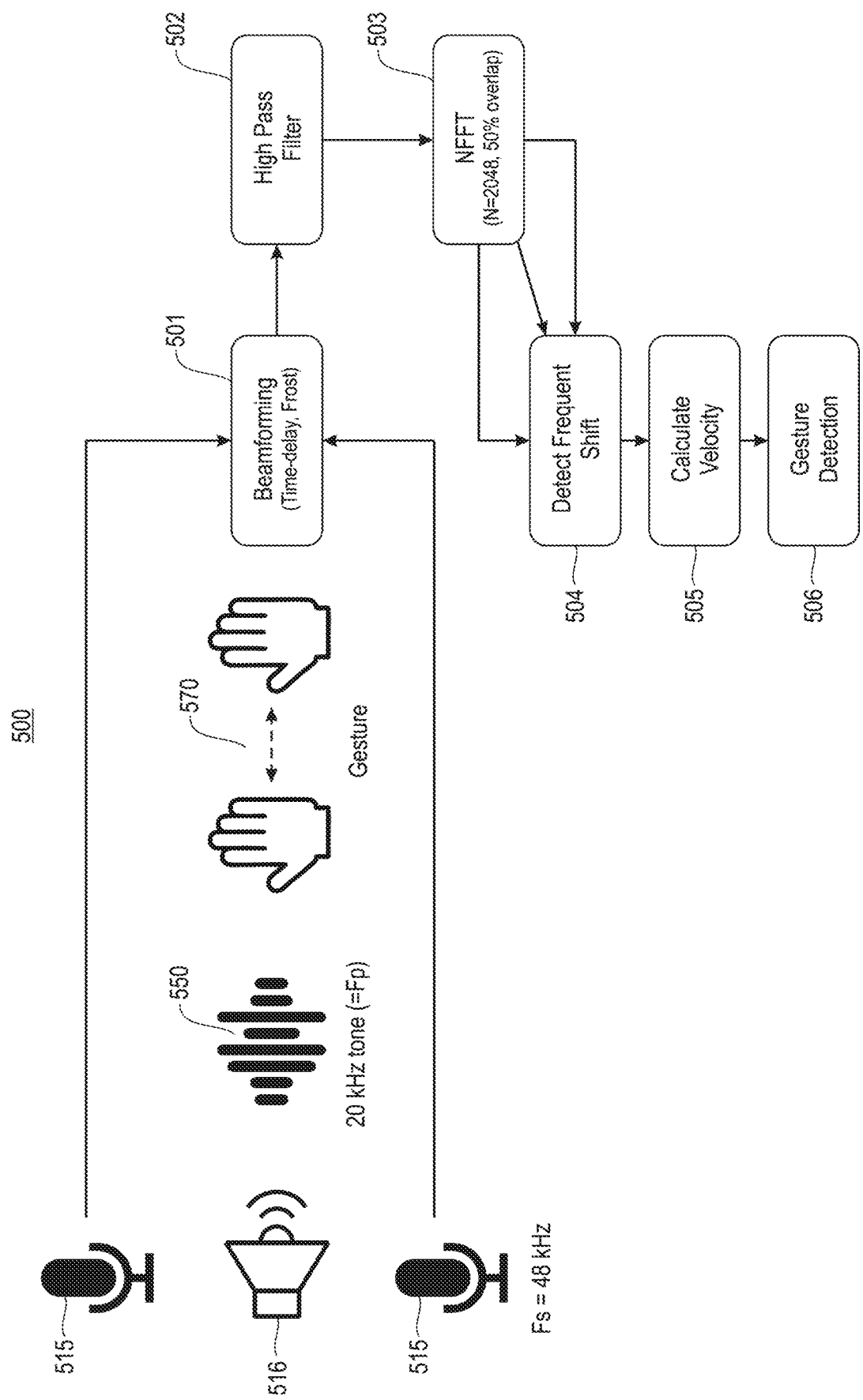
FIG. 5 is a block diagram illustrating a process for gesture detection, according to an exemplary embodiment of the invention.

FIG. 5 is a block diagram illustrating a process for gesture detection, according to an exemplary embodiment of the invention. Referring to FIG. 5, in a system 500 with a voice interactive device (e.g., Amazon Echo®, Google Home™, Apple HomePod™) having at least two microphones 515 and a speaker 516, a pilot frequency 150 (e.g., 20 kHz) is emitted by the device, and a gesture 570 causes a reflected waveform (e.g., 19-21 kHz) which is detected using the sampling frequency (e.g., 48 kHz) to be received by one or more of the microphones 515. As noted in connection with FIG. 4A, beam-forming techniques 501, such as, for example, time-delay, Frost, active, etc., are performed to receive the reflected signal in a manner which increases a range of detection of the frequency shift. The beam-formed reflected signal is passed through a high pass filter 502. A beam-formed signal with a frequency higher than a predetermined cutoff frequency (e.g., 19 kHz) is allowed to pass through the high pass filter 502. For example, instead of a peak at 20 kHz (e.g., the peak of the pilot signal), the beam-formed reflected signal will have a different peak (e.g., 19.5 kHz or 21.5 KHz, if, for example, a hand is moving toward or away from the device) and include other variations from the pilot signal (e.g., secondary, tertiary, or broader peak).

The signal from the high pass filter 502 is processed utilizing a non-equispaced fast Fourier transform (NFFT) 503 with, for example, 50% overlap between contiguous sections, where N=2048, and the frequency shift caused by the gesture 570 is detected (element 504). At blocks 505 and 506, the velocity of the gesture 570 is calculated, and the gesture 570 is detected. As noted above, each gesture results in a unique deviation (with respect to frequency and/or phase shift) to the pilot signal, which is present in the reflected signal. A machine learning classification method can be used to identify the unique signature caused by a particular gesture.

In accordance with an embodiment of the present invention, an evaluation of resolution in connection with the example in FIG. 5 is given by:

$$\text{Frequency bin size } \Delta f = \frac{Fs}{NFFT} = 23.43 \text{ Hz}.$$

Velocity resolution $\Delta v \approx 0.2$ m/s for $F_p = 20$ kHz and $c = 343$ m/s (speed of sound in air).

$$\left(\text{Using: } F_{shift} = F_p * \left(\frac{c+v}{c-v}\right)\right)$$

Figure 6:
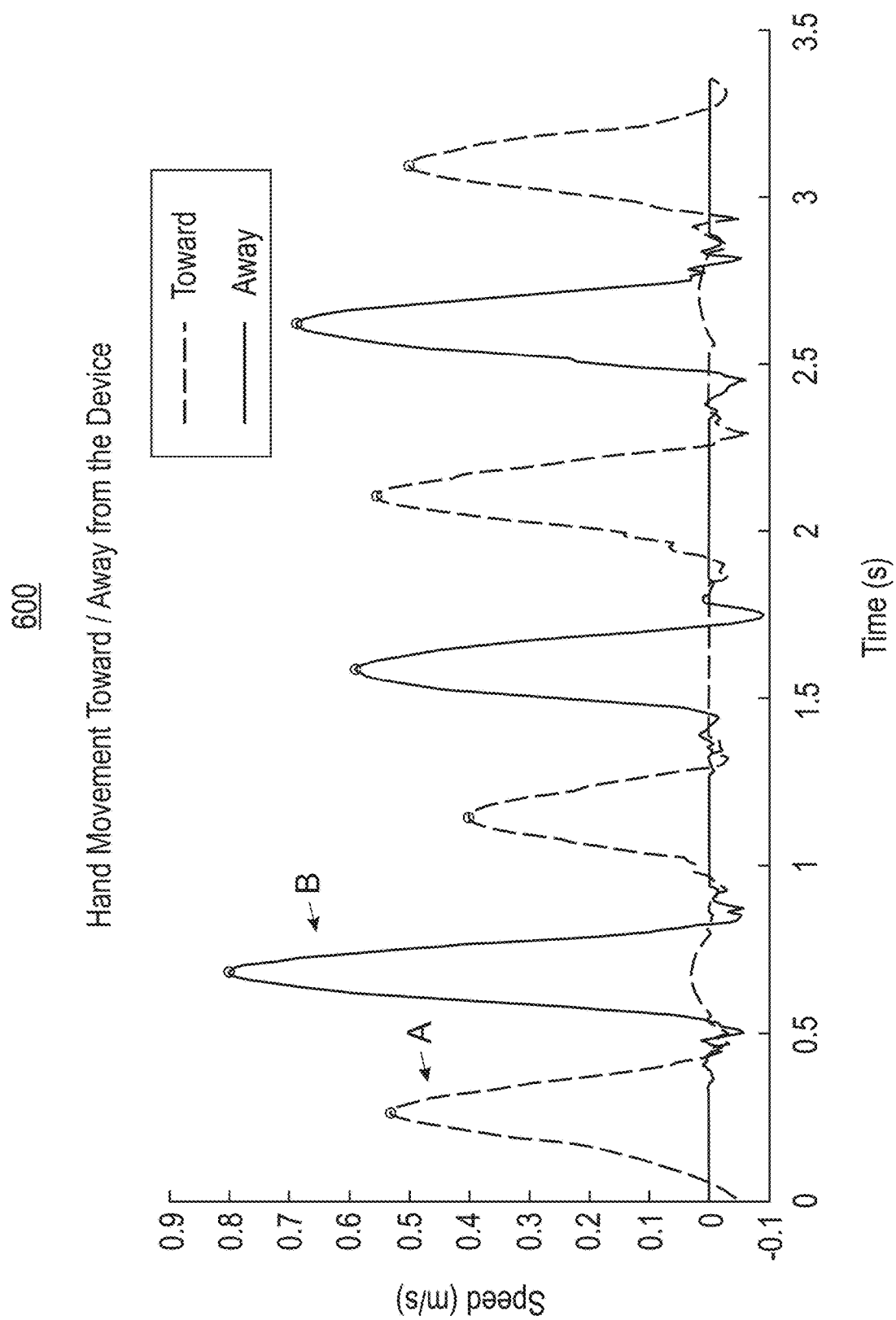
FIG. 6 is a graph illustrating hand movement toward and away from a device, according to an embodiment of the present invention.

FIG. 6 is a graph illustrating hand movement toward and away from a device, according to an embodiment of the present invention. Referring to FIG. 6, in the graph 600, plot A illustrates detection of hand movement speed of hand movements toward a device (e.g., device 110), and plot B illustrates detection of hand movement speed of hand movements away from a device in experiments conducted in accordance with an embodiment of the present invention.

Figure 7:
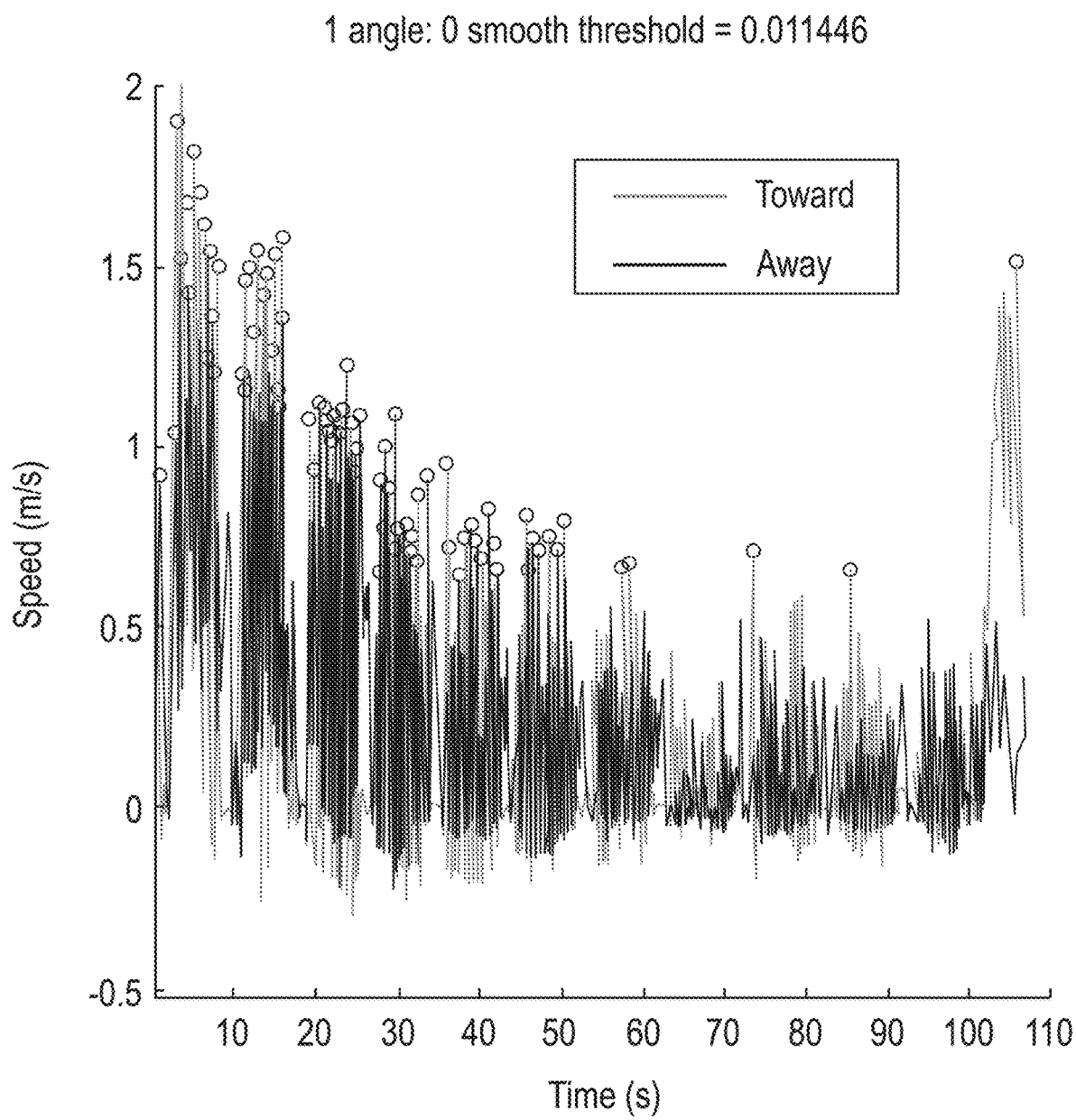
FIG. 7 is a graph illustrating gestures detected up to 5 meters from a device, according to an exemplary embodiment of the invention.

FIG. 7 is a graph illustrating gestures detected up to 5 meters from a device, according to an exemplary embodiment of the invention. Referring to FIG. 7, the graph 700 illustrates gesture detection speed of gestures made toward and away from a device (e.g., device 110) up to 5 meters from the device in experiments conducted in accordance with an embodiment of the present invention. Each block of graph (with an empty space in between) was done at an incremental distance of 0.5 meters away from the device. The graph shows the gesture detection until 6 meters (12 blocks) away from the device.

Figure 8:
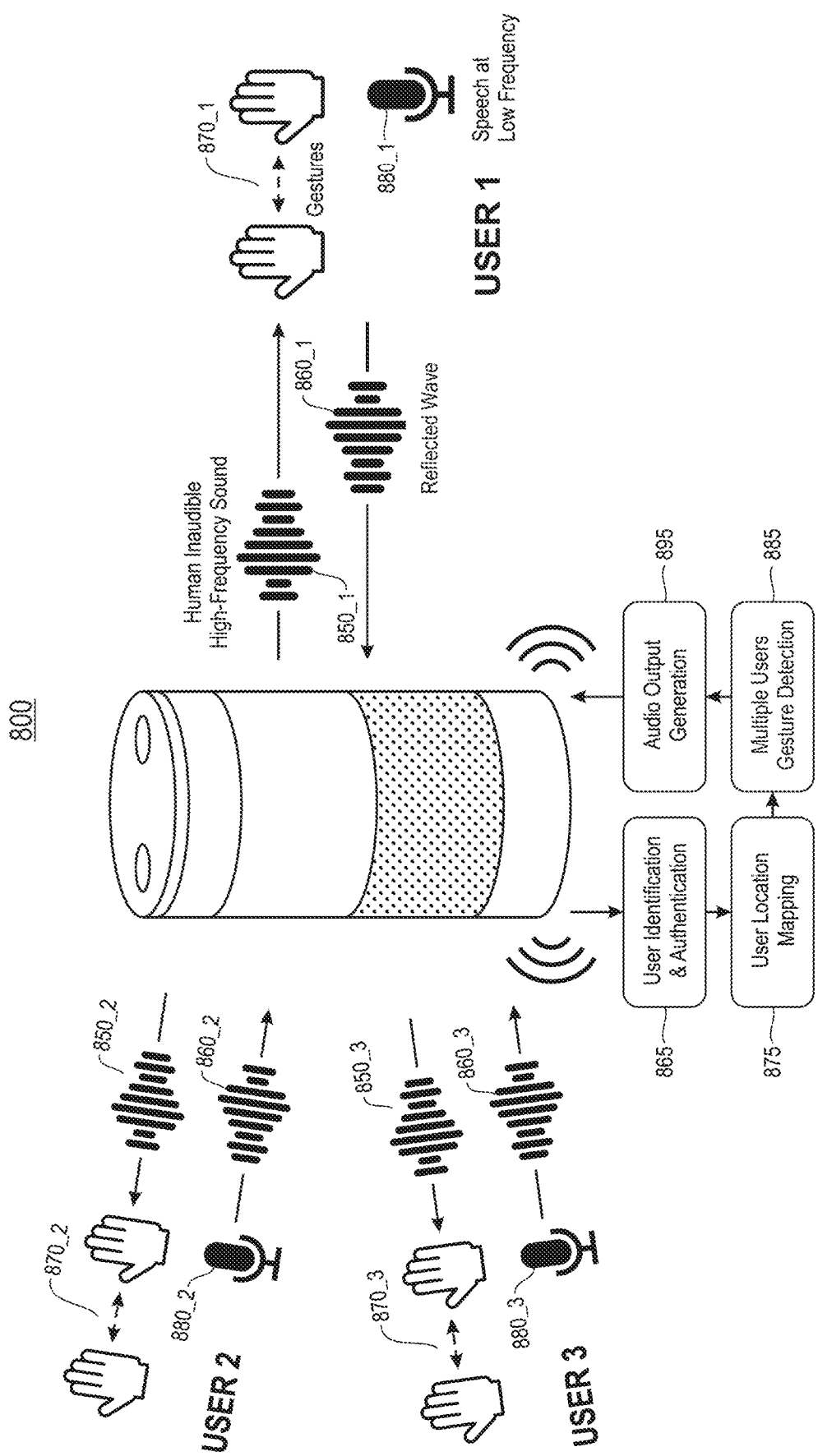
FIG. 8 depicts a system for multiple user interaction and gesture detection, according to an exemplary embodiment of the present invention.

FIG. 8 depicts a system for multiple user interaction and gesture detection, according to an exemplary embodiment of the present invention. As shown in FIG. 8 by lines and/or arrows, the components of the system 800 are operatively coupled to each other via, for example, physical connections, such as wired and/or direct electrical contact connections, and/or wireless connections, such as, for example, Wi-Fi™, BLUETOOTH®, IEEE 802.11, and/or networks, including but not limited to, a LAN, WAN, cellular network, ad hoc networks, WANET, satellite network or the Internet.

By way of non-limiting example, in accordance with an embodiment of the present invention, referring to FIG. 8, the system 800 includes a device 810, such as, for example, a voice interactive device (e.g., Amazon Echo®, Google Home™, Apple HomePod™), which includes a voice activated interface for interfacing with a human user, and outputs audio responses in response to user inquiries and/or prompts. The system 800 further includes, and the device 810 is operatively coupled to a user identification and authentication module 865, a user location mapping module 875, a multiple users gesture detection module 885 and an audio output generation module 895. In accordance with an embodiment of the present invention, the device 810 includes one or more speakers which output high frequency pilot signals 850_1, 830_2 and 850_3 which, like pilot signal 150 described in connection with FIG. 1, produce a sound that is not audible to humans. The pilot signals 850_1, 850_2 and 850_3 are continuously emitted from the device 810 and each have a frequency of, for example, greater than 20 kHz, which is outside the audible spectrum for human ears. The pilot frequency will be the same for all users (e.g., Users 1, 2 and 3). As explained further herein, based on the positions of the multiple users, the tonal frequency of the pilot signals 850_1, 850_2 and 850_3 can be changed. For example, referring to FIG. 9 described further herein, with the users at 0, 40 and 102 degrees, 6 kHz pilot signals 850_1, 850_2 and 850_3 may work best for discerning gestures when the users are at those positions, but for users at 0, 43, and 97 degrees, 5.7 kHz pilot signals 850_1, 850_2 and 850_3 may work best for discerning gestures.

Although three users 1, 2 and 3 are illustrated, the embodiments of the invention are not limited thereto. The embodiment described in connection with FIG. 8 can apply to, for example, 2 users or more than 3 users. As with FIG. 1, the device 810 further includes a plurality of microphones, which can be arranged as an array, in for example, a circular or other-shaped configuration, which receive, for example, user voice signals, and reflected pilot signals 860_1, 860_2 and 860_3.

According to an embodiment of the present invention, multiple users perform gestures 870_1, 870_2 and 870_3, including, but not necessarily limited to, hand gestures, such as waves, stop motions, raise up/bring down motions, etc. When the gestures 870_1, 870_2 and 870_3, such as, for example, hand movements, are made, the gestures 870_1, 870_2 and 870_3 act as reflectors so that the frequency and/or phase of the reflected pilot signals 860_1, 860_2 and 860_3 perceived by one or more microphones of the device change. This change in frequency and/or phase is directly related to the speed of the gestures and the frequencies of the pilot signals 850_1, 850_2 and 850_3 emitted by the speaker. When there is no moving user in the surrounding environment, there is no detected frequency and/or phase shift.

The system 800 uses beam-forming capabilities on the microphone array of the device 810 to identify multiple users, map the location of each user, detect audio and gesture input from multiple users, and respond accordingly. The system 800 is configured to engage with multiple users (e.g., users 1, 2, and 3) simultaneously with voice and gesture-based modalities. For example, the system 800 responds to gesture and voice-input 870_1-870_3 and 880_1-880_3 from a plurality of users 1, 2 and 3 and performs functions associated with the gesture and voice-input.

According to an embodiment, the user identification and authentication module 865 identifies and authenticates individual users 1, 2 and 3 based on their voice sample from a wake-up word or introduction phrase. The user location mapping module 875 simultaneously maps all users 1, 2 and 3 to specific locations based on beam-forming methods using voice samples from wake-up words or introduction phrases. In order to map all users 1, 2 and 3 to specific locations, device 810, utilizing the user location mapping module 875, provides audio cues to users to change their corresponding locations (e.g., angles 0° to 360° around a circumference of the device 810) to locations which allow discrimination between the respective gestures 870_1, 870_2 and 870_3 of the users 1, 2 and 3. Alternatively, or in addition, in order to map all users 1, 2 and 3 to specific locations, device 810, utilizing the user location mapping module 875, changes the tonal frequency of the pilot signals 850_1, 850_2 and 850_3 in case the users' locations are too close for accurately discriminating their gestures. The change in tonal frequencies allows for discrimination between the respective gestures 870_1, 870_2 and 870_3 of the users 1, 2 and 3.

The multiple users gesture detection module 885 uses a combination of beam-forming methods (e.g., time-delay, active, Frost) along with gesture detection (e.g., Doppler, phase shift) and gesture to command mapping methods discussed in connection with FIG. 1 to simultaneously detect the gestures of multiple users and generate corresponding functions associated with the detected gestures. Depending on the corresponding function, an audio output generation module 895 generates appropriate audio in response to gesture and/or voice prompts 880_1, 880_2 and/or 880_3 provided by the users 1, 2 and 3.

In accordance with an embodiment of the present invention, multiple directional speakers can be beam-formed to increase the robustness of gesture recognition. Multiple directional speakers can be used to provide directional audio feedback to multiple users.

The system 800 provides platform features to allow developers to write multi-modal, multi-user chatbots that can take as input the inferred utterances and gestures of multiple people, and engage with them through the audio-output of the device. In accordance with an embodiment of the present invention, the platform provides a state-flow system that can take inputs derived from multiple modalities from multiple users to design interactive turn-based systems. The platform includes, for example, the following components: (i) natural language/gesture understanding; (ii) dialog flow or state management, and (iii) natural language generation to be output as speech by the device. This will enable design of applications around, for example, gaming, collaborative editing, and virtual reality/augmented reality (VR/AR) for voice activated audio devices.

In a non-limiting illustrative example, a device 810 interacting with multiple users can engage them in the popular game of "rock, paper, scissors". Players (e.g., users 1, 2 and 3) are positioned around the device 810 and each initiate the device a wake-up phrase such as, but not limited to, "Alexa" and "Ok Google." In response, device 810 uses voice recognition techniques to recognize each user 1, 2 and 3 from their voice sample (e.g., 880_1, 880_2 and 880_3) and maps the users 1, 2 and 3 to their location (e.g., direction relative to the device 810) using beam-forming algorithms (such as time-delay, active, Frost, etc.). Voice recognition techniques can include using speech features extracted from individual user voices to train a multi-class classifier (e.g., machine learning).

In case two or more users 1, 2 and 3 are positioned too close to each other to accurately distinguish their gestures from each other, the device 810 can provide audio cues to position the users 1, 2 and/or 3 further apart and/or change the frequency of the pilot signals 850_1, 850_2 and 850_3 to allow for discrimination between the respective gestures 870_1, 870_2 and 870_3 of the users 1, 2 and 3. In playing the game, each player puts out their hand gesture, and the device 810 beam-forms in each relevant direction and uses methods (such as Doppler, phase shift, or a combination) to determine the gesture of each player. The device 810 can provide an audio output including a winner if any, maintain a score, and ask players to move on to the next round.

Figure 9:
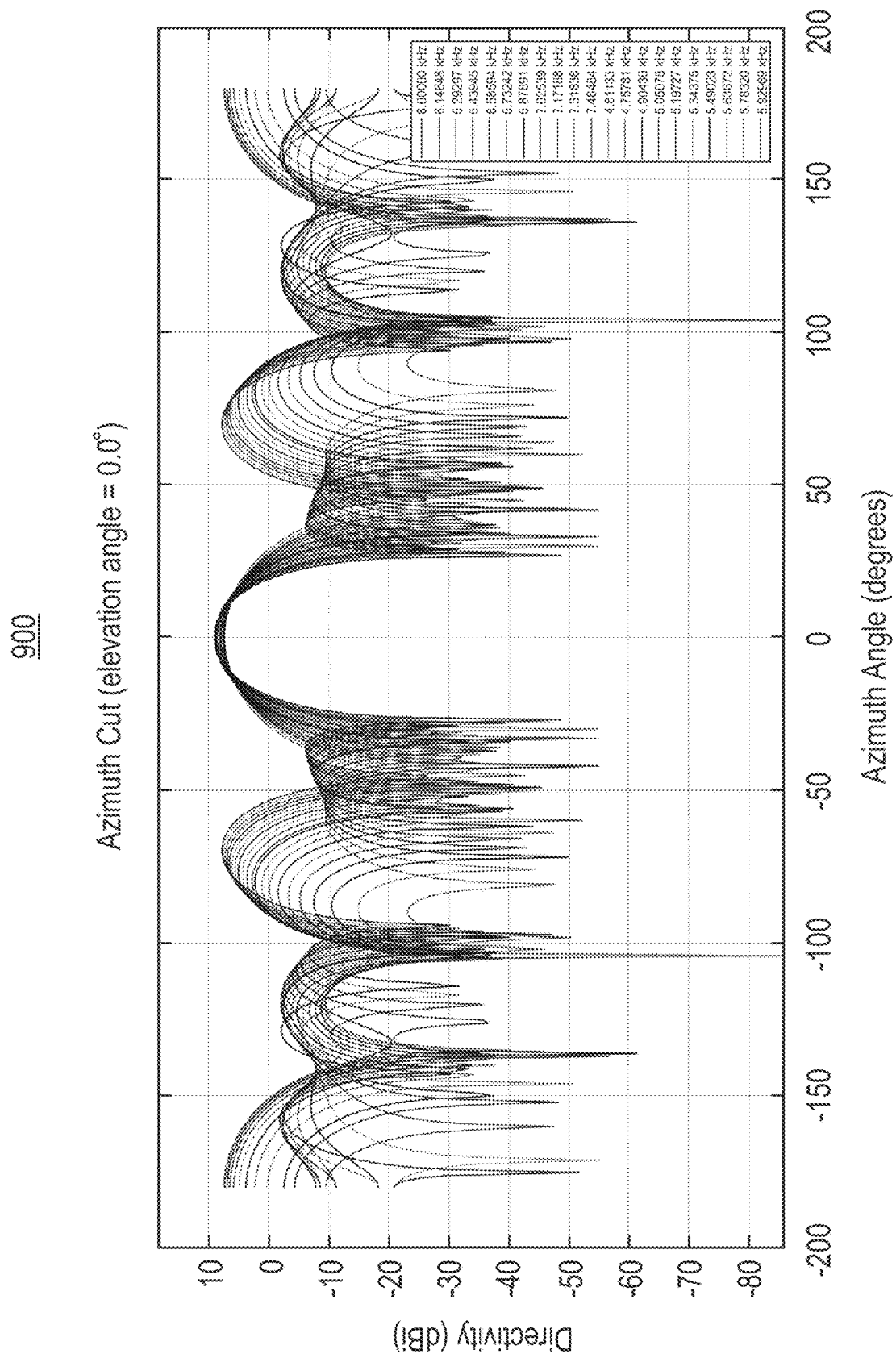
FIG. 9 is a graph illustrating how different frequencies support different locations, according to an exemplary embodiment of the present invention.

FIG. 9 is a graph illustrating how different frequencies support different locations, according to an exemplary embodiment of the present invention. Referring to the graph 900 in FIG. 9, some pilot signal frequencies exhibit higher directivity for certain angles than other pilot signal frequencies. In other words, some frequencies are better for discerning gestures for certain angles with respect to the device than other frequencies. At different audio frequencies of interaction, users at different angles with respect to the device can be more easily tracked. For example, at 6 kHz, user A at 0°, user B at 40°, and user C at 102° can be best tracked. Based on this, audio cues can be provided to adjust users' positions and/or based on users' locations, and/or a particular frequency of the pilot signals (e.g., 6 kHz) can be emitted from the device to accurately capture the gestures of each user.

Figure 10:
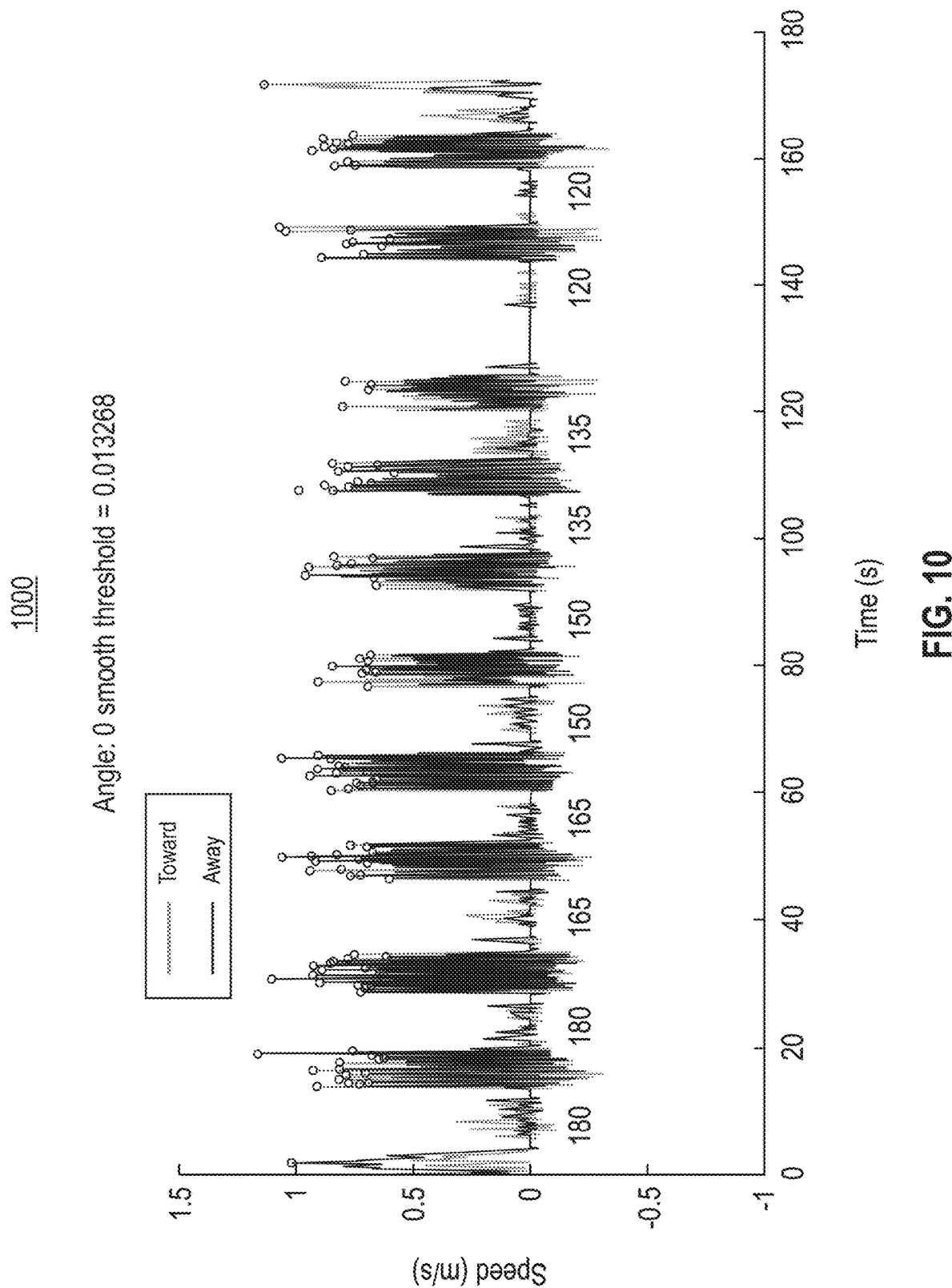
FIG. 10 is a graph illustrating impact of user gestures on each other, according to an exemplary embodiment of the present invention.

FIG. 10 is a graph illustrating impact of user gestures on each other, according to an exemplary embodiment of the present invention. Referring to FIG. 10, with beam-forming at 0°, and two users performing gestures, when user A is at 0° with respect to the device, and user B is at 180°, 165°, 150°, 135° or 120° with respect to the device, graph 1000 (by the lower peaks at 180°, 165°, 150°, 135° or 120°) illustrates that the impact of user B's gestures, when user B is at those angles, is minimal on user A's gestures regardless of whether the gestures of users A and B are toward or away from the device.

Figure 11A:
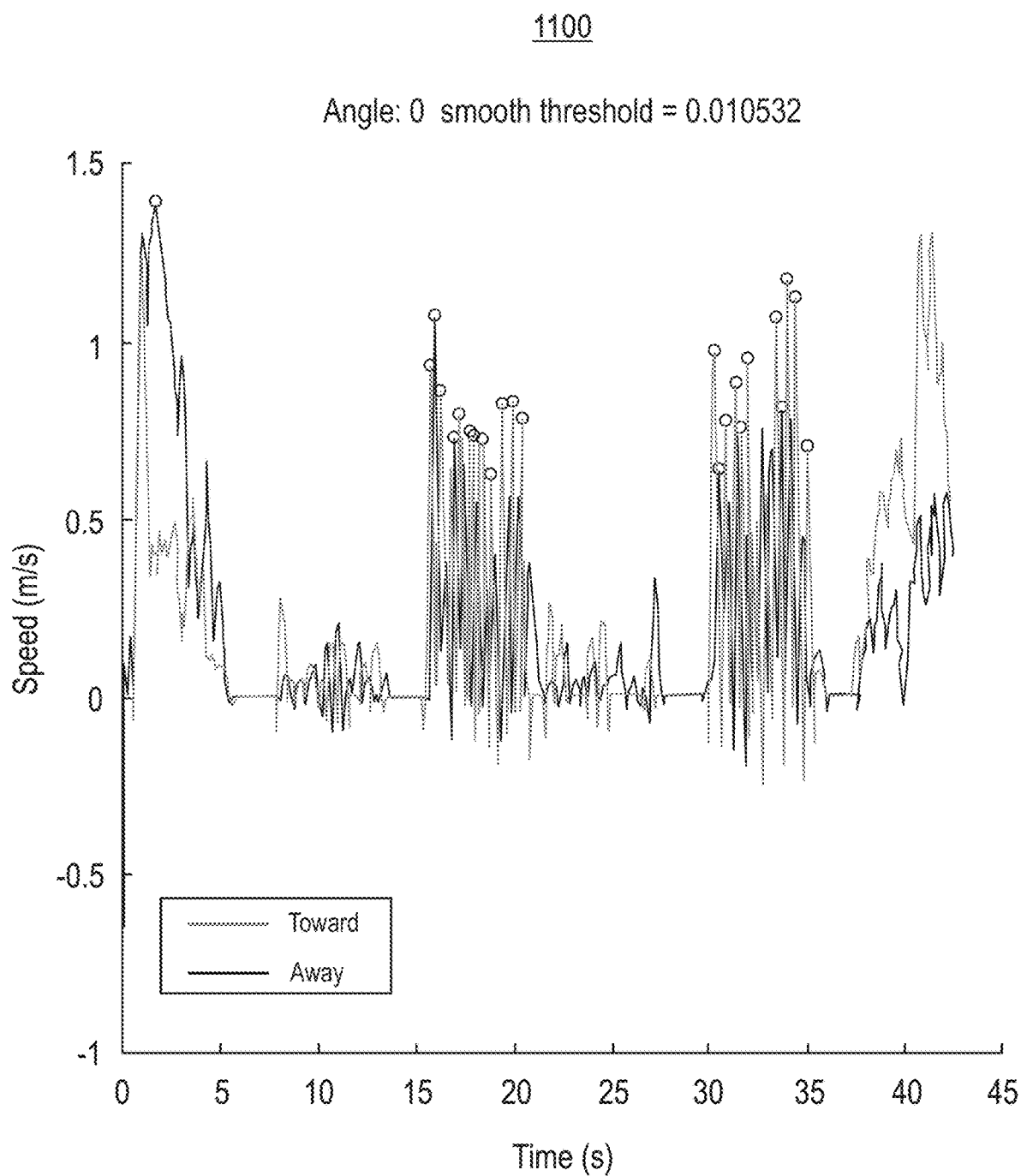
FIGS. 11A and 11B are graphs illustrating impact of user gestures on each other, according to an exemplary embodiment of the present invention.
Figure 11B:
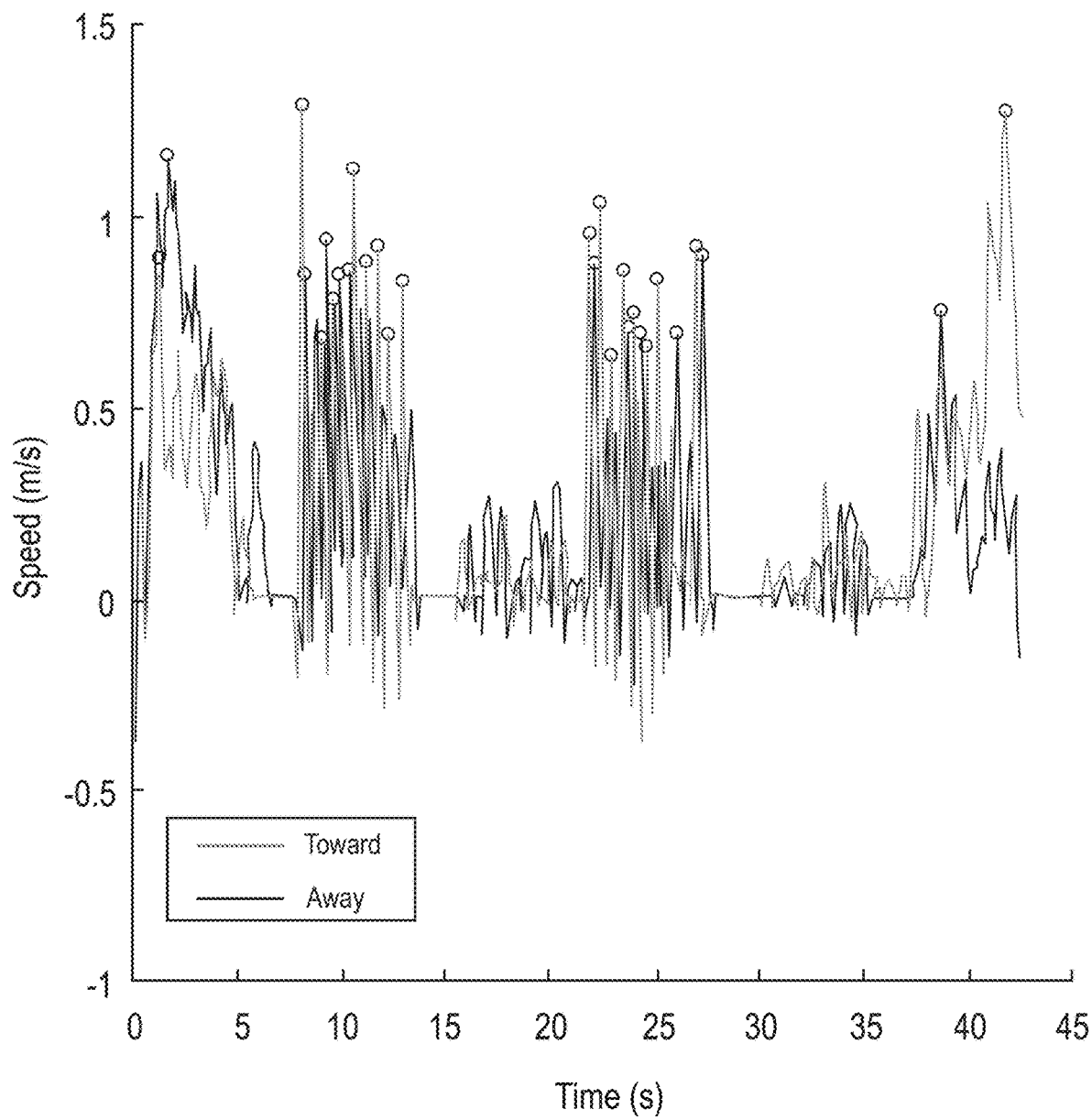

FIGS. 11A and 11B are graphs illustrating impact of user gestures on each other, according to an exemplary embodiment of the present invention. Referring to graphs 1100 and 1110, user A is at 0° with respect to the device, and user B is at −60° with respect to the device, and they are each performing a gesture. By the high peaks being out of phase with respect to each other on the compared graphs 1100 and 1110, the graphs illustrate that user A and B in these positions (0° and −60°) do not have much impact on each other's gesture, and hence their gestures can be discriminated from each other regardless of whether the gestures of users A and B are toward or away from the device.

Figure 12A:
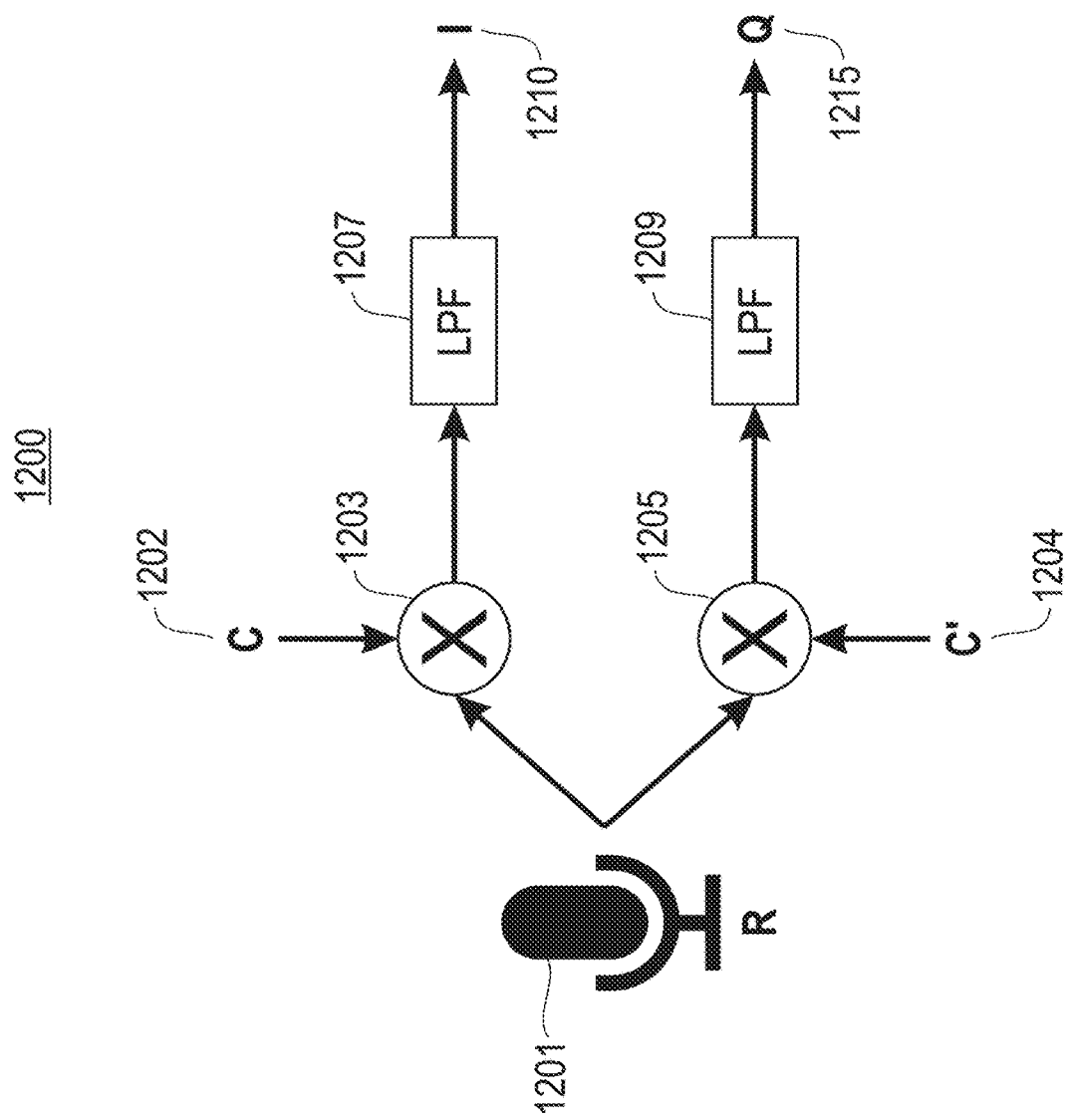
FIG. 12A is a block diagram illustrating separation of in-phase (I) and quadrature (Q) components from a carrier, according to an exemplary embodiment of the present invention.
Figure 12B:
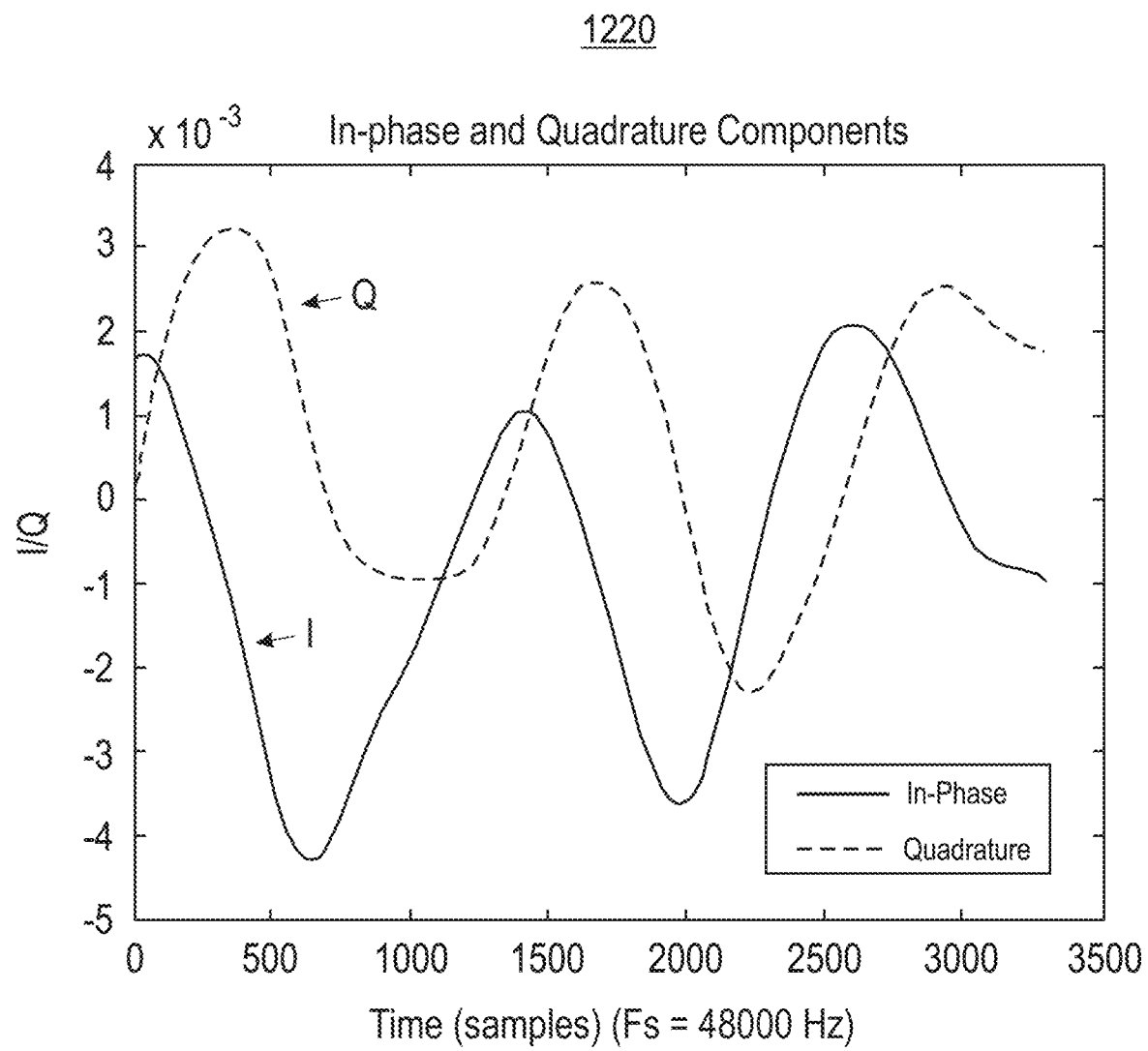
FIG. 12B is a graph illustrating in-phase (I) and quadrature (Q) components, according to an exemplary embodiment of the present invention.
Figure 12C:
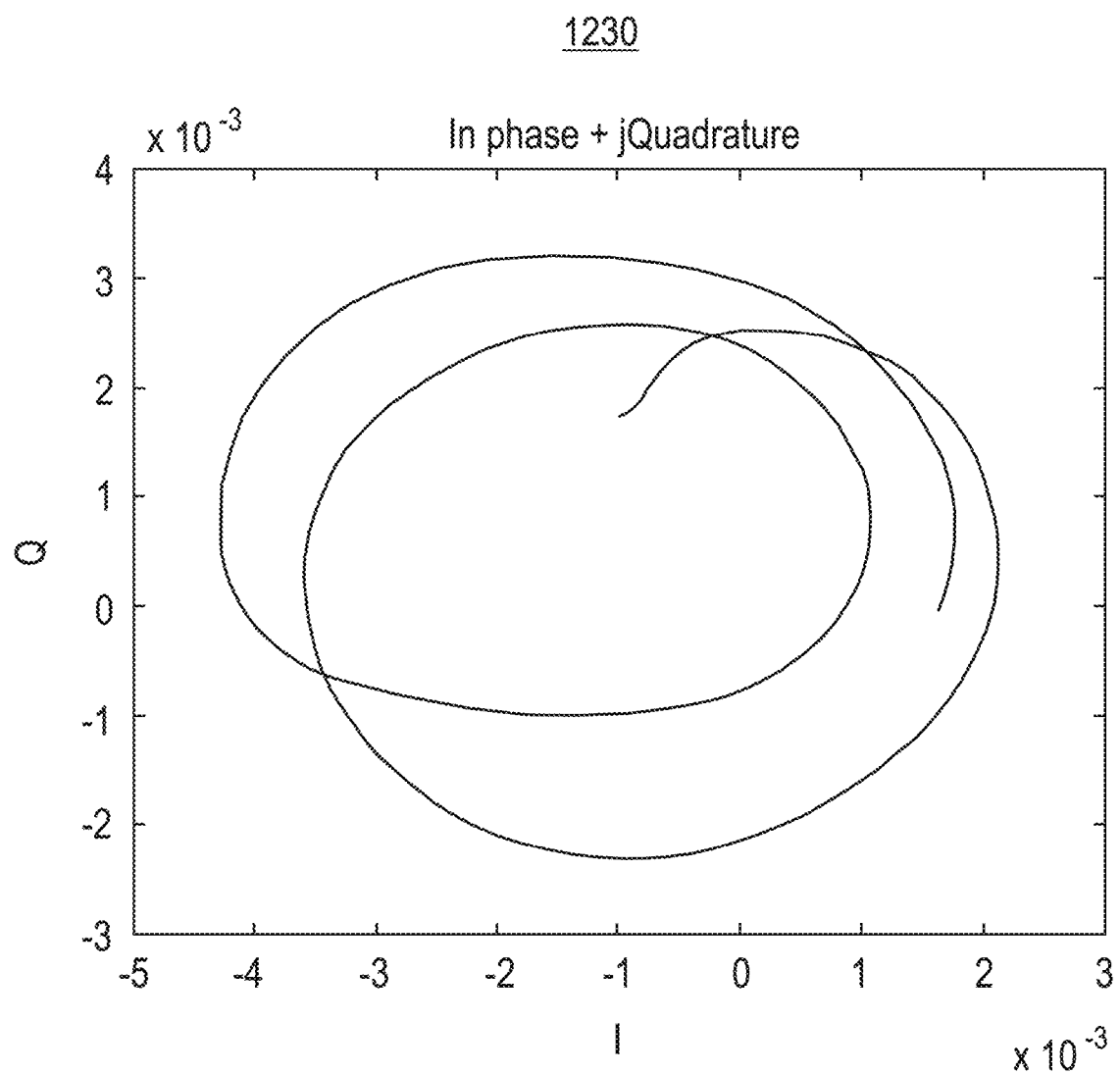
FIG. 12C is a graph illustrating in-phase (I) and jQuadrature (jQ) circles, according to an exemplary embodiment of the present invention.

As an alternative, or in addition to using Doppler shift methods, FIGS. 12A-12C illustrate using phase shift methods to determine changes in the reflected pilot signal caused by user motion. FIG. 12A is a block diagram illustrating separation of in-phase (I) and quadrature (Q) components from a carrier, according to an exemplary embodiment of the present invention. In the system 1200, the I and Q components are separated from the respective carriers C 1202 and C' 1204. To do this, using multipliers 1203 and 1205, the received signal R 1201 is separately multiplied with the initial carrier C 1202 and its 90° phase shifted version C' 1204. Then the two resulting signals are each passed through a low pass filter (LPF) 1207 and 1209 to obtain the I and Q waveforms 1210 and 1215, respectively.

FIG. 12B is a graph illustrating in-phase (I) and quadrature (Q) components, according to an exemplary embodiment of the present invention. The graph 1220 illustrates I/Q waveforms. The I/Q waveforms vary as sinusoids when gestures are being made and remain stagnant in absence of any motion.

FIG. 12C is a graph illustrating in-phase (I) and jQuadrature (jQ) circles, according to an exemplary embodiment of the present invention. Referring to the graph 1230 in FIG. 12C, when interpreted as a complex vector (I+jQ), circles are traced on the argand plane. The direction of motion is interpreted from the direction of rotation of the complex vector (anticlockwise or clockwise). To tackle the static multi path effect, the center of circles formed by the complex vector is approximated by taking the mean of two diametrical end points. This is done for all pairs of peaks in I/Q. I and Q are then normalized using these centers calculated. For the dynamic multi paths, multiple frequencies are emitted and change in distance is approximated from each of these and finally fitted with linear regression.

Phase shift is further defined according to the following:

$$Y(t) = A\cos(2\pi ft), \text{ original signal}$$

$$R(t) = A'\cos\left(2\pi ft - \frac{2\pi fd(t)}{c} - \theta\right), \text{ reflected signal}$$

$$I(t) = A'\cos\left(\frac{2\pi fd(t)}{c} + \theta\right)$$

$$Q(t) = A'\sin\left(\frac{2\pi fd(t)}{c} + \theta\right)$$

$$C(t) = A'e^{\left(\frac{2\pi fd(t)}{c} + \theta\right)}$$

$$C_{normalized}(t) = A'e^{\left(\frac{2\pi fd(t)}{c}\right)}$$

θ is based on static multi paths while errors in d(t) are based on dynamic multi paths.

Figure 13:
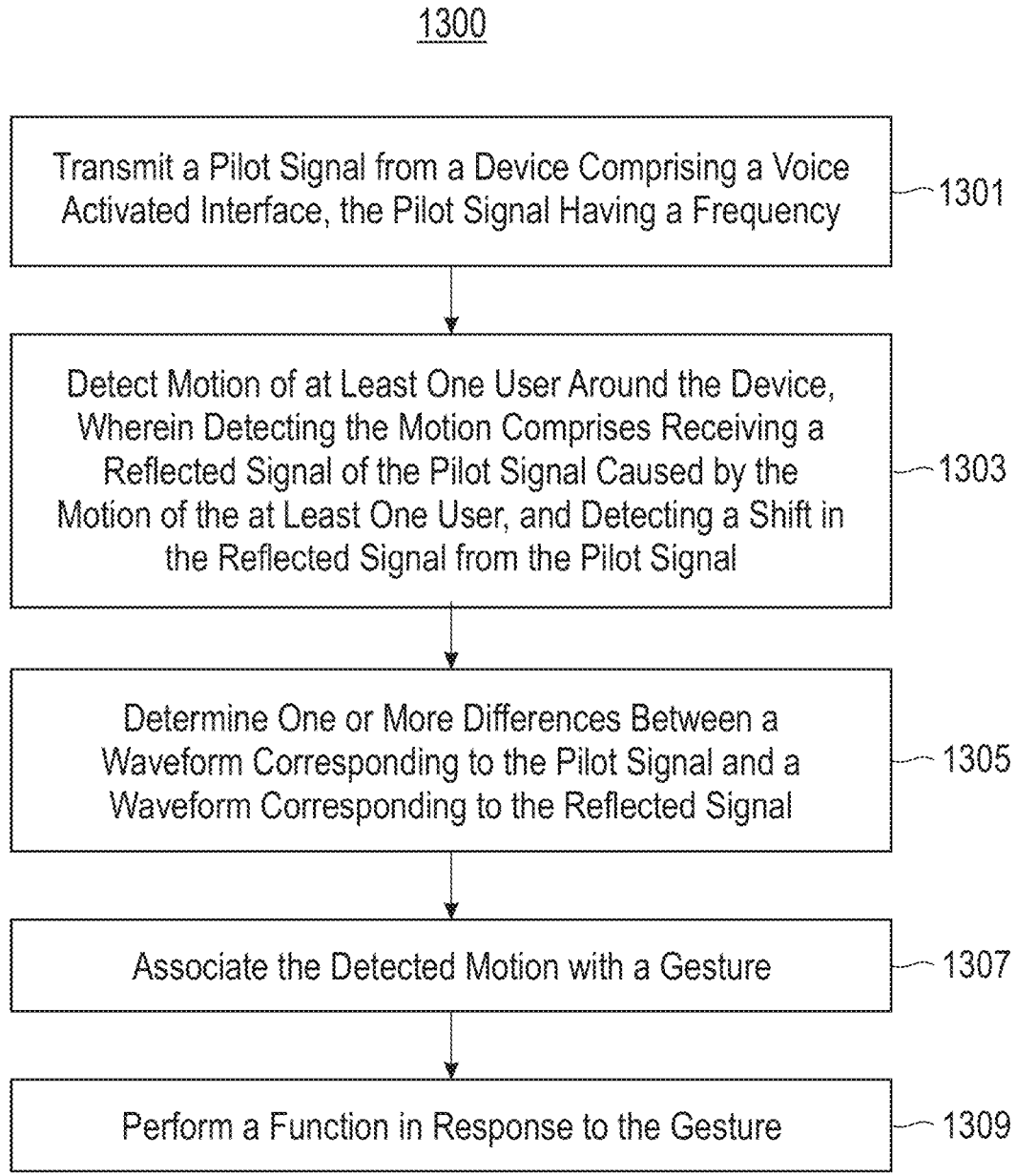
FIG. 13 depicts a process for multiple user interaction and gesture detection, according to an exemplary embodiment of the present invention

FIG. 13 is a flow diagram of a process multiple user interaction and gesture detection, according to an exemplary embodiment of the invention. Referring to FIG. 13, the process 1300 includes, at block 1301, transmitting a pilot signal having a frequency from a device comprising a voice activated interface, and at block 1303, detecting motion of at least one user around the device. The user can be positioned, for example, greater than 0 meters to 5 meters or more from the device, and the detecting comprises: (i) receiving a reflected signal of the pilot signal caused by the motion of the at least one user; and (ii) detecting a shift in the reflected signal from the pilot signal. Referring to block 1305, detecting the shift includes determining one or more differences between a waveform corresponding to the pilot signal and a waveform corresponding to the reflected signal. The detecting of the shift can comprise determining a frequency (e.g., Doppler) shift of the reflected signal by determining a peak difference between the waveform corresponding to the pilot signal and the waveform corresponding to the reflected signal. The frequency shift is based on a velocity of the detected motion. In addition, detecting of the shift can comprise passing the reflected signal through a high pass filter, and processing an output from the high pass filter utilizing a fast Fourier transform (FFT). Alternatively, or in addition, the detecting of the shift can comprise determining a phase shift of the reflected signal by (i) multiplying the reflected signal with a carrier and a phase shifted carrier, and (ii) passing the respective results of said multiplying through low pass filters to obtain I and Q waveforms, respectively.

The process 1300 further comprises, at block 1307, associating the detected motion with a gesture, and at block 1309, performing a function in response to the gesture. Associating the detected motion with the gesture can comprise matching the detected shift with a corresponding gesture. The function comprises, for example, adjusting audio volume of the device and/or navigating through an audio clip being played by the device.

The process may further comprise mapping a plurality of users to respective locations around the device, wherein the mapping comprises determining that the initial locations of two or more of the plurality of users around the device will prevent distinguishing respective motions of the two or more users. The mapping may further comprise providing respective audio cues to the two or more users to change their corresponding initial locations to locations which allow the respective motions of the two or more users to be distinguished, and/or changing the frequency of the pilot signal to a frequency which allows the respective motions of the two or more users to be distinguished.

The process may further comprise simultaneously detecting respective motions of the plurality of users around the device, associating the detected respective motions with a plurality of respective gestures, and performing a plurality of respective functions corresponding to operation of the device in response to the plurality of respective gestures.

The process may further comprise spatially filtering (e.g., beam-forming) at least one of the pilot signal and the reflected signal with respect to a plurality of elements in an array in the device. The array can be a microphone array, and the plurality of signals are spatially filtered (e.g., beam-formed) in a manner which increases a range of detection of the frequency and/or phase shift. In other words, the spatially filtering (e.g., beam-forming) increases a distance from the device over which the motion of the at least one user is detected. The beam-forming comprises, but is not necessarily limited to, time-delay, active and/or Frost techniques.

The present invention may be implemented via a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 14:
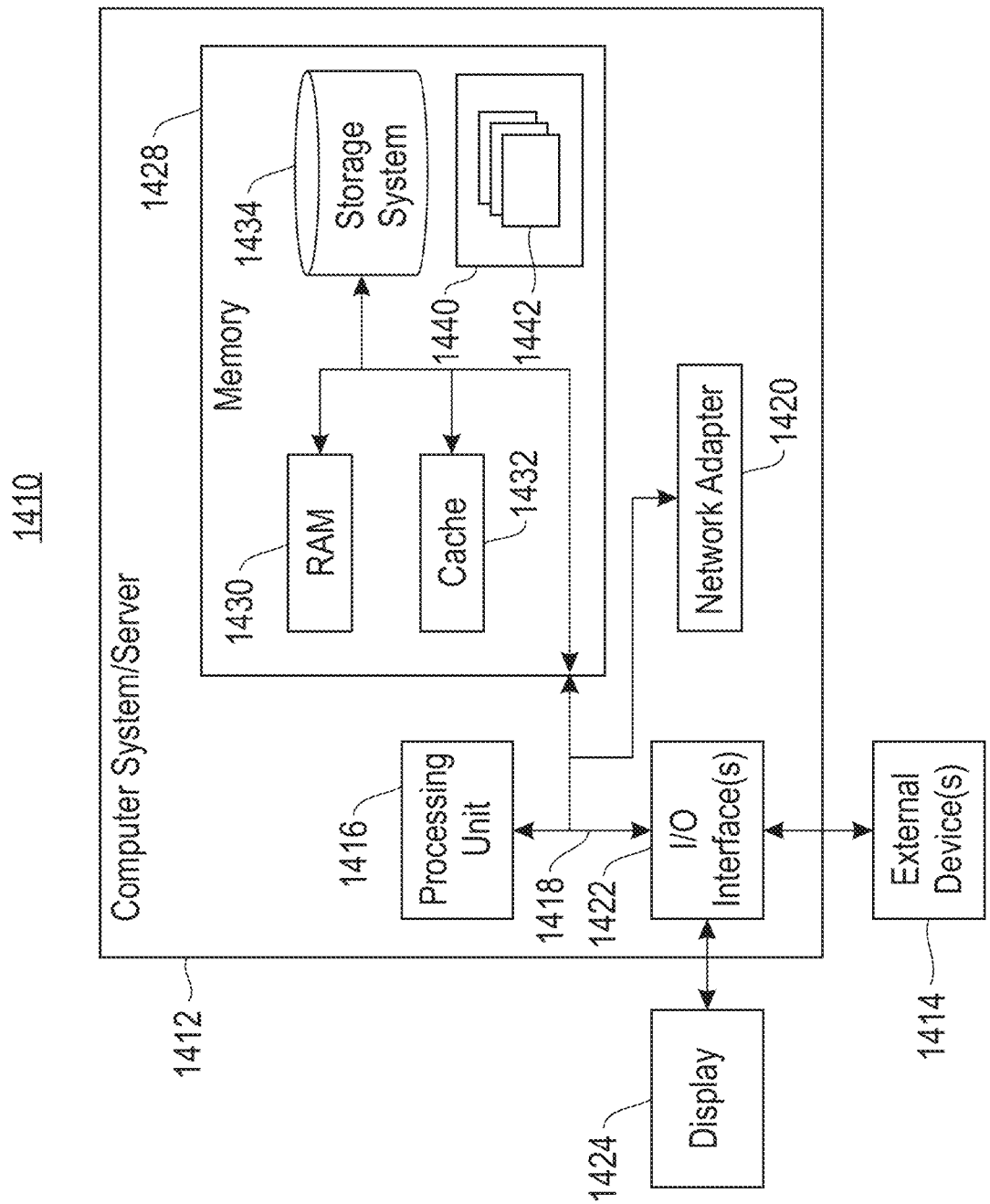
FIG. 14 depicts a computer system in accordance with which one or more components/steps of techniques of the invention may be implemented, according to an exemplary embodiment of the invention.

One or more embodiments can make use of software running on a general-purpose computer or workstation. With reference to FIG. 14, in a computing node 1410 there is a computer system/server 1412, which is operational with numerous other general purpose or special purpose computing system environments or configurations. Examples of well-known computing systems, environments, and/or configurations that may be suitable for use with computer system/server 1412 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1412 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1412 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 14, computer system/server 1412 in computing node 1410 is shown in the form of a general-purpose computing device. The components of computer system/server 1412 may include, but are not limited to, one or more processors or processing units 1416, a system memory 1428, and a bus 1418 that couples various system components including system memory 1428 to processor 1416.

The bus 1418 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1412 typically includes a variety of computer system readable media. Such media may be any available media that is accessible by computer system/server 1412, and it includes both volatile and non-volatile media, removable and non-removable media.

The system memory 1428 can include computer system readable media in the form of volatile memory, such as RAM 1430 and/or cache memory 1432. The computer system/server 1412 may further include other removable/non-removable, volatile/nonvolatile computer system storage media. By way of example only, storage system 1434 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1418 by one or more data media interfaces. As depicted and described herein, the memory 1428 may include at least one program product having a set (e.g., at least one) of program modules that are configured to carry out the functions of embodiments of the invention. A program/utility 1440, having a set (at least one) of program modules 1442, may be stored in memory 1428 by way of example, and not limitation, as well as an operating system, one or more application programs, other program modules, and program data. Each of the operating system, one or more application programs, other program modules, and program data or some combination thereof, may include an implementation of a networking environment. Program modules 1442 generally carry out the functions and/or methodologies of embodiments of the invention as described herein.

Computer system/server 1412 may also communicate with one or more external devices 1414 such as a keyboard, a pointing device, a display 1424, etc., one or more devices that enable a user to interact with computer system/server 1412, and/or any devices (e.g., network card, modem, etc.) that enable computer system/server 1412 to communicate with one or more other computing devices. Such communication can occur via I/O interfaces 1422. Still yet, computer system/server 1412 can communicate with one or more networks such as a LAN, a general WAN, and/or a public network (e.g., the Internet) via network adapter 1420. As depicted, network adapter 1420 communicates with the other components of computer system/server 1412 via bus 1418. It should be understood that although not shown, other hardware and/or software components could be used in conjunction with computer system/server 1412. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and personal digital assistants (PDAs)).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 15:
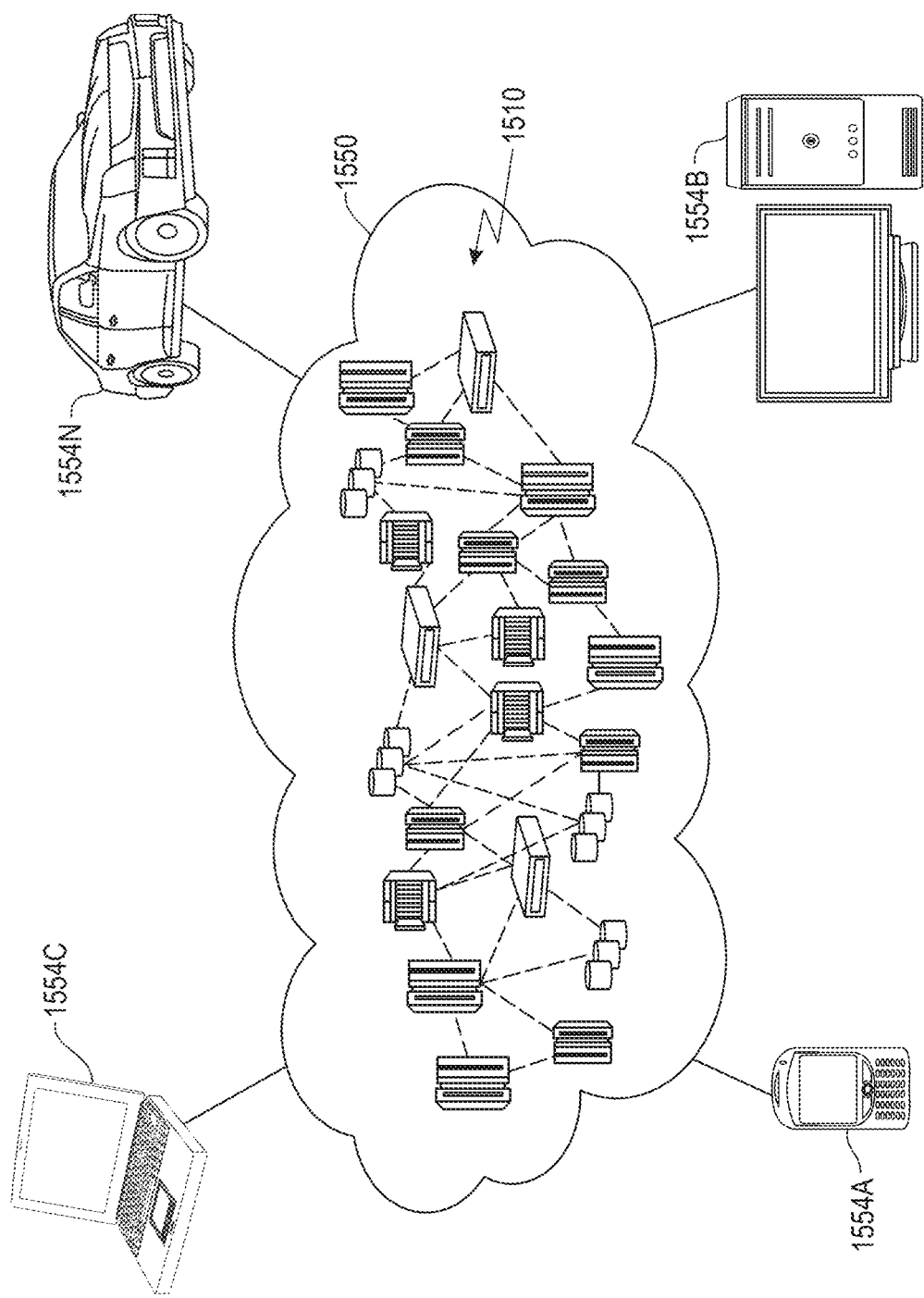
FIG. 15 depicts a cloud computing environment, according to an exemplary embodiment of the present invention.

Referring now to FIG. 15, illustrative cloud computing environment 1550 is depicted. As shown, cloud computing environment 1550 includes one or more cloud computing nodes 1510 with which local computing devices used by cloud consumers, such as, for example, a PDA or a cellular telephone 1554A, a desktop computer 1554B, a laptop computer 1554C, and/or an automobile computer system 1554N may communicate. Nodes 1510 may communicate with one another. They may be grouped (not shown) physically or virtually, in one or more networks, such as Private, Community, Public, or Hybrid clouds as described hereinabove, or a combination thereof. This allows cloud computing environment 1550 to offer infrastructure, platforms and/or software as services for which a cloud consumer does not need to maintain resources on a local computing device. It is understood that the types of computing devices 1554A-N shown in FIG. 15 are intended to be illustrative only and that computing nodes 1510 and cloud computing environment 1550 can communicate with any type of computerized device over any type of network and/or network addressable connection (e.g., using a web browser).

Figure 16:
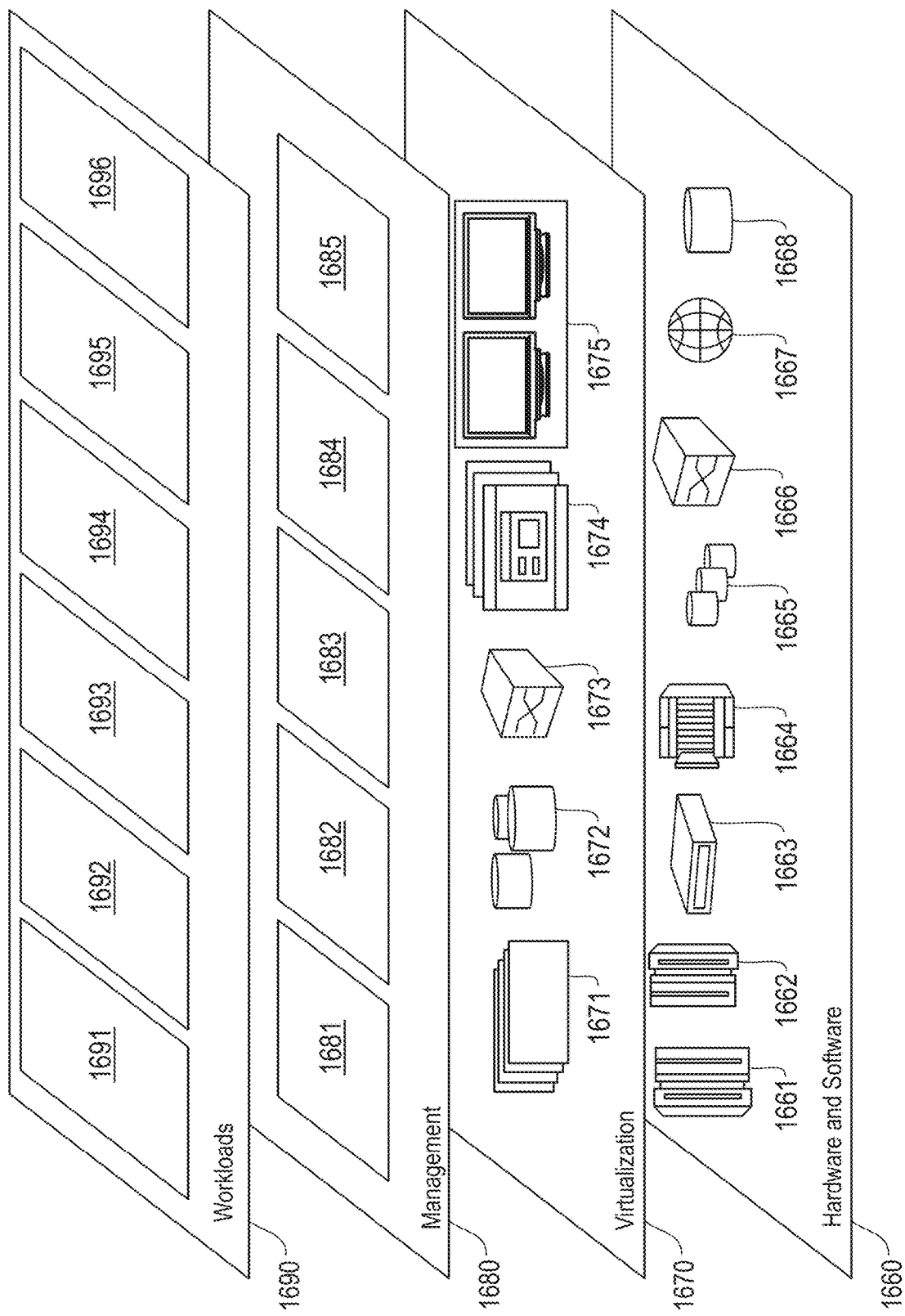
FIG. 16 depicts abstraction model layers, according to an exemplary embodiment of the present invention.

Referring now to FIG. 16, a set of functional abstraction layers provided by cloud computing environment 1550 (FIG. 15) is shown. It should be understood in advance that the components, layers, and functions shown in FIG. 16 are intended to be illustrative only and embodiments of the invention are not limited thereto. As depicted, the following layers and corresponding functions are provided:

Hardware and software layer 1660 includes hardware and software components. Examples of hardware components include: mainframes 1661; RISC (Reduced Instruction Set Computer) architecture based servers 1662; servers 1663; blade servers 1664; storage devices 1665; and networks and networking components 1666. In some embodiments, software components include network application server software 1667 and database software 1668.

Virtualization layer 1670 provides an abstraction layer from which the following examples of virtual entities may be provided: virtual servers 1671; virtual storage 1672; virtual networks 1673, including virtual private networks; virtual applications and operating systems 1674; and virtual clients 1675.

In one example, management layer 1680 may provide the functions described below. Resource provisioning 1681 provides dynamic procurement of computing resources and other resources that are utilized to perform tasks within the cloud computing environment. Metering and Pricing 1682 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1683 provides access to the cloud computing environment for consumers and system administrators. Service level management 1684 provides cloud computing resource allocation and management such that required service levels are met. Service Level Agreement (SLA) planning and fulfillment 1685 provide pre-arrangement for, and procurement of, cloud computing resources for which a future requirement is anticipated in accordance with an SLA.

Workloads layer 1690 provides examples of functionality for which the cloud computing environment may be utilized. Examples of workloads and functions which may be provided from this layer include: mapping and navigation 1691; software development and lifecycle management 1692; virtual classroom education delivery 1693; data analytics processing 1694; transaction processing 1695; and gesture detection and analysis 1696, which may perform various functions described above with respect to systems 100 and 800.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer-implemented method, comprising:
   transmitting a pilot signal from a device comprising a voice activated interface, the pilot signal having a frequency;
   detecting motion of at least one user around the device, wherein said detecting the motion comprises:
   receiving a reflected signal of the pilot signal caused by the motion of the at least one user; and
   detecting a shift in the reflected signal from the pilot signal, wherein said detecting the shift comprises determining differences between a waveform corresponding to the pilot signal and a waveform corresponding to the reflected signal by analyzing a peak frequency value difference between said waveform corresponding to the pilot signal and said waveform corresponding to the reflected signal and a peak width difference between said waveform corresponding to the pilot signal and said waveform corresponding to the reflected signal,
   wherein said detecting the shift comprises (i) passing the reflected signal through a high pass filter, and (ii) processing output from the high pass filter utilizing a non-equispaced fast Fourier transform (NFFT), and wherein said detecting the shift further comprises:
   multiplying the reflected signal (R) with a carrier (C) and its 90 degree phase shifted carrier (C');
   passing the respective results of said multiplying through low pass filters to obtain in-phase (I) and quadrature (Q) waveforms, respectively;
   interpreting the in-phase (I) and quadrature (Q) waveforms as a complex vector; and
   determining a direction of the detected motion associated with the shift in the reflected signal based at least in part on rotation of the complex vector;
   associating the detected motion with a gesture via application of at least one machine learning classification technique, comprising one or more support vector machines, to information pertaining to the detected shift, thereby identifying a shift-related signature caused by the detected motion and mapping the shift-related signature to training data associated with multiple user motions; and
   performing a function in response to the gesture.

2. The computer-implemented method of claim 1, comprising:
   mapping a plurality of users to respective locations around the device.

3. The computer-implemented method of claim 2, wherein said mapping comprises determining that the initial locations of two or more of the plurality of users around the device will prevent distinguishing respective motions of the two or more users.

4. The computer-implemented method of claim 3, comprising providing respective audio cues to the two or more users to change their initial locations to locations which allow the respective motions of the two or more users to be distinguished.

5. The computer-implemented method of claim 3, comprising changing the frequency of the pilot signal to a frequency which allows the respective motions of the two or more users to be distinguished.

6. The computer-implemented method of claim 2, comprising:
   detecting respective motions of the plurality of users in the area of the device;
   associating the detected respective motions with a plurality of respective gestures; and
   performing a plurality of respective functions corresponding to operation of the device in response to the plurality of respective gestures.

7. The computer-implemented method of claim 1, comprising:
   spatially filtering at least one of the pilot signal and the reflected signal with respect to a plurality of microphones in an array in the device.

8. The computer-implemented method of claim 7, wherein said spatially filtering increases the distance from the device over which the motion of the at least one user is detected.

9. The computer-implemented method of claim 1, wherein said associating the detected motion with the gesture comprises matching the detected shift with a corresponding gesture.

10. The computer-implemented method of claim 1, wherein the function comprises one of (i) adjusting audio volume of the device and (ii) navigating through an audio clip being played by the device.

11. The computer implemented method of claim 1, wherein the at least one user is positioned greater than about zero meters to about five meters from the device.

12. A computer program product, the computer program product comprising a tangible computer readable storage medium having program instructions embodied therewith, the program instructions executable by a device to cause the device to:
   transmit a pilot signal from the device, the pilot signal having a frequency and the device comprising a voice activated interface;
   detect motion of at least one user around the device, wherein in detecting the motion, the program instructions further cause the device to:
   receive a reflected signal of the pilot signal caused by the motion of the at least one user; and detect a shift in the reflected signal from the pilot signal, wherein in detecting the shift, the program instructions further cause the device to determine differences between a waveform corresponding to the pilot signal and a waveform corresponding to the reflected signal by analyzing a peak frequency value difference between said waveform corresponding to the pilot signal and said waveform corresponding to the reflected signal and a peak width difference between said waveform corresponding to the pilot signal and said waveform corresponding to the reflected signal,
   wherein said detecting the shift comprises (i) passing the reflected signal through a high pass filter, and (ii) processing output from the high pass filter utilizing a non-equispaced fast Fourier transform (NFFT), and wherein said detecting the shift further comprises:
   multiplying the reflected signal (R) with a carrier (C) and its 90 degree phase shifted carrier (C'); passing the respective results of said multiplying through low pass filters to obtain in-phase (I) and quadrature (Q) waveforms, respectively;
   interpreting the in-phase (I) and quadrature (Q) waveforms as a complex vector; and determining a direction of the detected motion associated with the shift in the reflected signal based at least in part on rotation of the complex vector;
   associate the detected motion with a gesture via application of at least one machine learning classification technique, comprising one or more support vector machines, to information pertaining to the detected shift, thereby identifying a shift-related signature caused by the detected motion and mapping the shift-related signature to training data associated with multiple user motions; and
   perform a function in response to the gesture.

13. A system comprising:
   a memory; and
   at least one processor coupled to the memory and configured for:
   transmitting a pilot signal from a device comprising a voice activated interface, the pilot signal having a frequency;
   detecting motion of at least one user around the device, wherein said detecting the motion comprises:
   receiving a reflected signal of the pilot signal caused by the motion of the at least one user; and
   detecting a shift in the reflected signal from the pilot signal, wherein said detecting the shift comprises determining differences between a waveform corresponding to the pilot signal and a waveform corresponding to the reflected signal by analyzing a peak frequency value difference between said waveform corresponding to the pilot signal and said waveform corresponding to the reflected signal and a peak width difference between said waveform corresponding to the pilot signal and said waveform corresponding to the reflected signal,
   wherein said detecting the shift comprises (i) passing the reflected signal through a high pass filter, and (ii) processing output from the high pass filter utilizing a non-equispaced fast Fourier transform (NFFT), and wherein said detecting the shift further comprises:
   multiplying the reflected signal (R) with a carrier (C) and its 90 degree phase shifted carrier (C');
   passing the respective results of said multiplying through low pass filters to obtain in-phase (I) and quadrature (Q) waveforms, respectively;
   interpreting the in-phase (I) and quadrature (Q) waveforms as a complex vector; and determining a direction of the detected motion associated with the shift in the reflected signal based at least in part on rotation of the complex vector;
   associating the detected motion with a gesture via application of at least one machine learning classification technique, comprising one or more support vector machines, to information pertaining to the detected shift, thereby identifying a shift-related signature caused by the detected motion and mapping the shift-related signature to training data associated with multiple user motions; and
   performing a function in response to the gesture.

14. The system according to claim 13, wherein the at least one processor is further configured for mapping a plurality of users to respective locations around the device.

15. A computer-implemented method, comprising:
   transmitting a pilot signal from a device comprising a voice activated interface, the pilot signal having a frequency;
   mapping a plurality of users to respective locations around the device;
   detecting respective motions of the plurality of users around the device, wherein said detecting the motion comprises:
   receiving respective reflected signals of the pilot signal from each of the plurality of users caused by the respective motions of the plurality of users; and
   detecting respective shifts in the respective reflected signals from the pilot signal, wherein said detecting the respective shifts comprises determining differences between a waveform corresponding to the pilot signal and waveforms corresponding to the respective reflected signals by analyzing a peak frequency value difference between said waveform corresponding to the pilot signal and said waveforms corresponding to the respective reflected signals and a peak width difference between said waveform corresponding to the pilot signal and said waveforms corresponding to the respective reflected signals,
wherein said detecting the shifts comprises (i) passing the reflected signals through a high pass filter, and (ii) processing output from the high pass filter utilizing a non-equispaced fast Fourier transform (NFFT), and wherein said detecting the shift further comprises:
multiplying the reflected signal (R) with a carrier (C) and its 90 degree phase shifted carrier (C'); passing the respective results of said multiplying through low pass filters to obtain in-phase (I) and quadrature (Q) waveforms, respectively;
interpreting the in-phase (I) and quadrature (Q) waveforms as a complex vector; and
determining a direction of the detected motion associated with the shift in the reflected signal based at least in part on rotation of the complex vector;
associating the detected respective motions with respective gestures via application of at least one machine learning classification technique, comprising one or more support vector machines, to information pertaining to the detected shifts, thereby identifying shift-related signatures caused by the detected motions and mapping the shift-related signatures to training data associated with multiple user motions; and
performing respective functions in response to the respective gestures.

16. The computer-implemented method of claim 15, wherein said mapping comprises determining that the initial locations of the plurality of users around the device will prevent distinguishing the respective motions of the plurality of users.

17. The computer-implemented method of claim 16, comprising at least one of:
providing respective audio cues to the plurality of users to change their initial locations to locations which allow the respective motions of the plurality of users to be distinguished; and
changing the frequency of the pilot signal to a frequency which allows the respective motions of the plurality of users to be distinguished.

* * * * *